United States Patent [19]

Toyoshima et al.

[11] 4,360,754
[45] Nov. 23, 1982

[54] MODE SUPPRESSED PIEZOELECTRIC DEVICE

[75] Inventors: Isao Toyoshima; Eizo Ohtsuka, both of Kanazawa, Japan

[73] Assignee: Murata Manufacturing Co., Ltd., Japan

[21] Appl. No.: 105,903

[22] Filed: Dec. 21, 1979

[30] Foreign Application Priority Data

| Dec. 27, 1978 | [JP] | Japan | 53-163021 |
| Jun. 4, 1979 | [JP] | Japan | 54-42259 |
| Jun. 4, 1979 | [JP] | Japan | 54-42260 |
| Jun. 4, 1979 | [JP] | Japan | 54-42261 |

[51] Int. Cl.³ .............................. H01L 41/08
[52] U.S. Cl. ............................ 310/366; 310/354; 310/348; 310/363; 310/365
[58] Field of Search ............. 310/348, 342, 344, 345, 310/352, 354, 363, 364, 366, 365

[56] References Cited

U.S. PATENT DOCUMENTS

| 2,385,896 | 10/1945 | Beckerath | 310/365 |
| 2,472,179 | 6/1949 | Tibbetts | 310/363 |
| 2,635,199 | 4/1953 | Wolfskill | 310/366 |
| 2,814,741 | 11/1957 | Minnich et al. | 310/344 X |
| 2,994,791 | 8/1961 | Shinada et al. | 310/365 |
| 3,495,105 | 2/1970 | Shimano | 310/366 |
| 3,562,764 | 2/1971 | Fujishima | 310/348 X |
| 4,112,324 | 9/1978 | Yamaguchi | 310/342 X |

FOREIGN PATENT DOCUMENTS

| 151750 | 4/1950 | Australia | 310/342 |
| 2922451 | 2/1978 | Fed. Rep. of Germany | 310/354 |
| 4740150 | 4/1968 | Japan | 310/366 |
| 44-16264 | 7/1969 | Japan | 310/348 |
| 44-23196 | 10/1969 | Japan | 310/345 |

Primary Examiner—Mark O. Budd
Attorney, Agent, or Firm—Ostrolenk, Faber, Gerb & Soffen

[57] ABSTRACT

A piezoelectric device having a casing and a piezoelectric unit supported in the casing by the use of a direction-oriented electroconductive pliable sheet. The piezoelectric unit has a plate-like shape with electrodes laminated on its opposite surfaces. The electrode provided on one surface of the piezoelectric unit extends and is disposed on the opposite surface for gathering all the electrodes on the opposite surface.

12 Claims, 98 Drawing Figures

Fig. 7
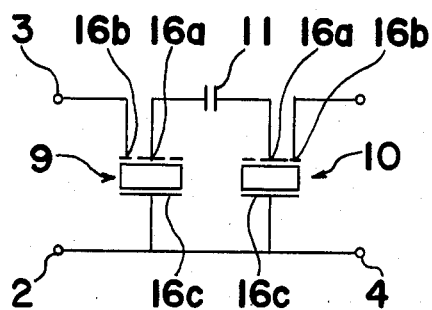
Fig. 8(a)
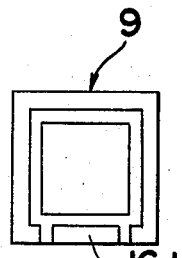
Fig. 8(b)
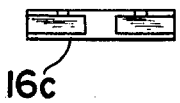
Fig. 9(a)
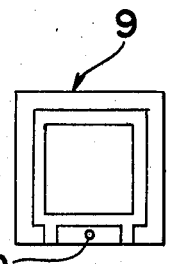
Fig. 9(b)
Fig. 10
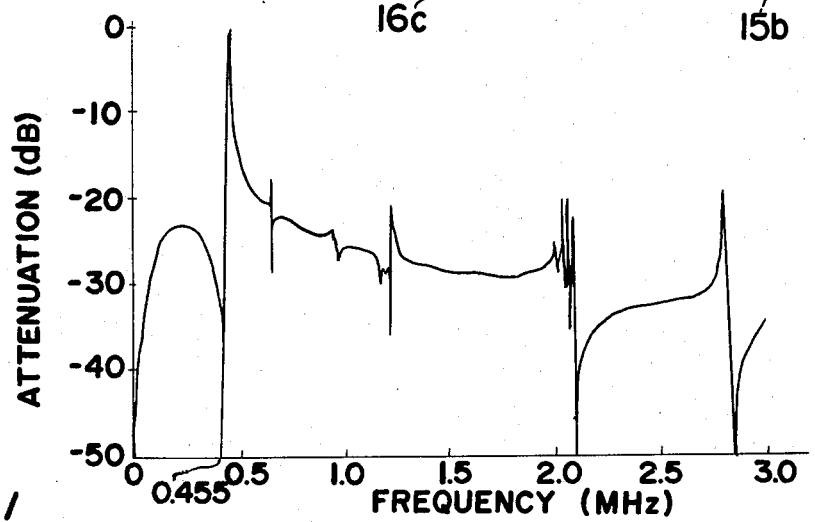
Fig. 11
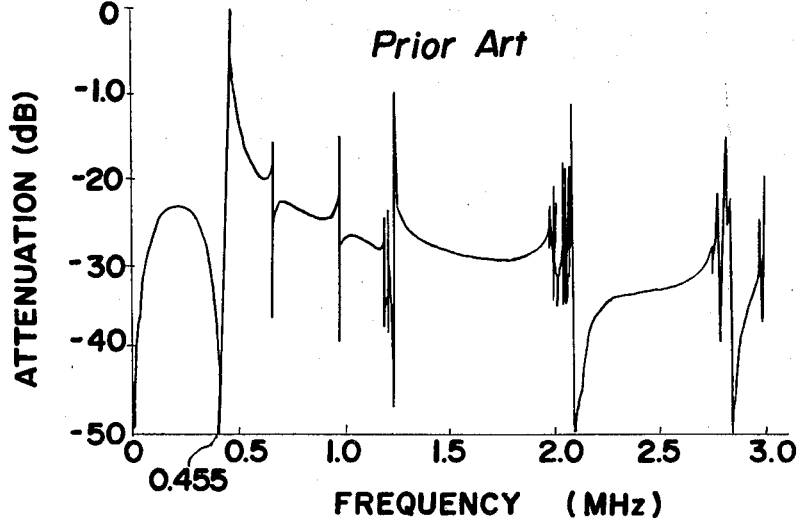
Prior Art Fig. 17
Fig. 18
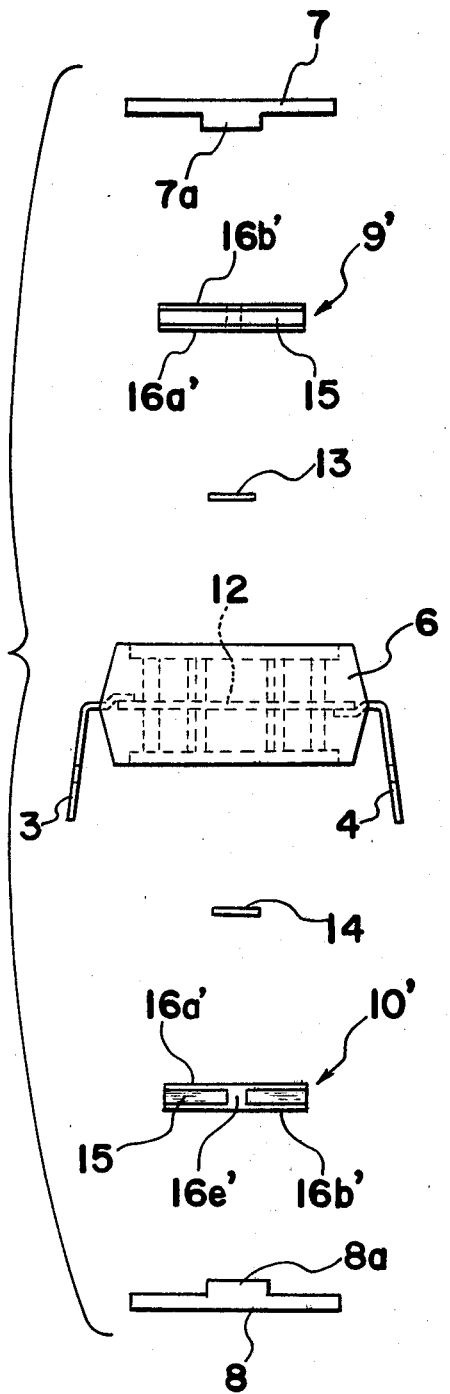
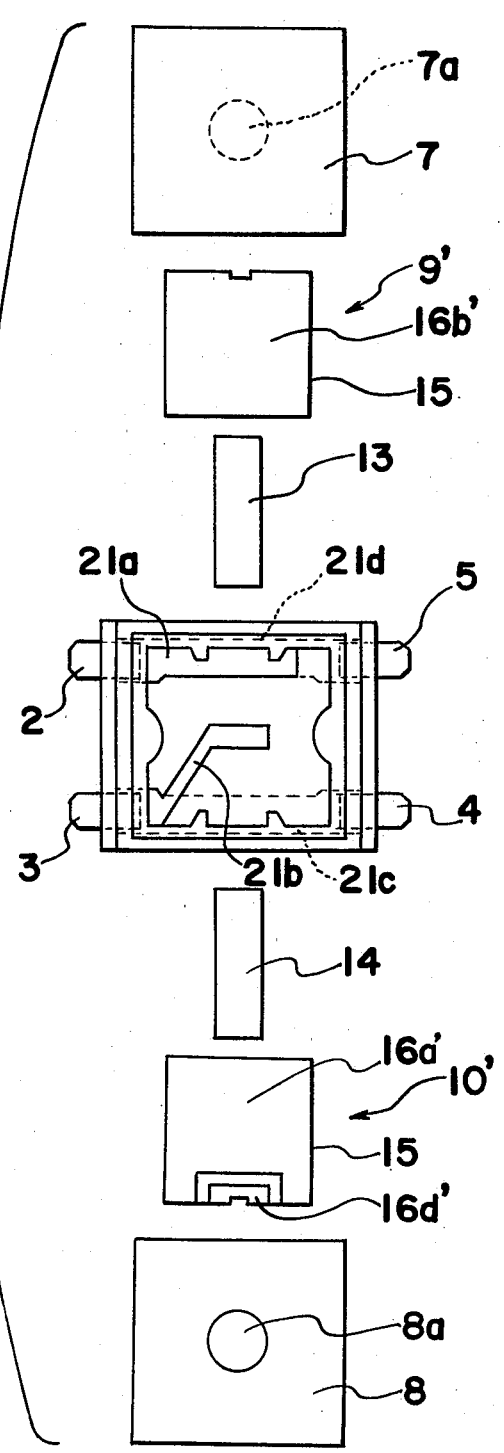

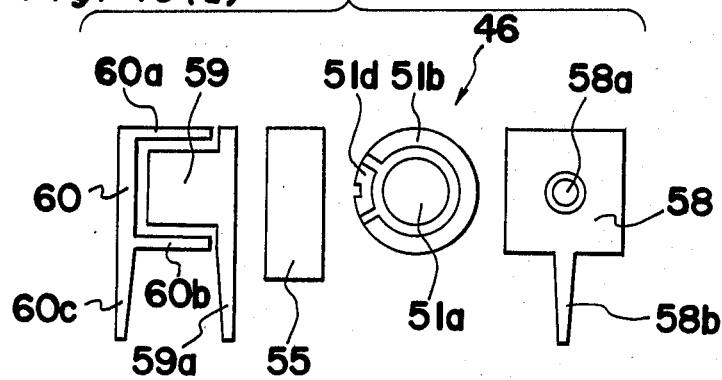
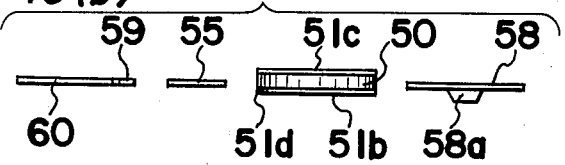
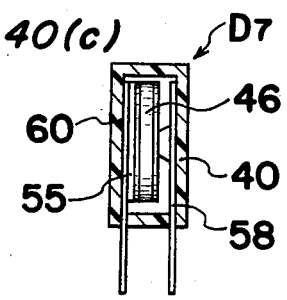
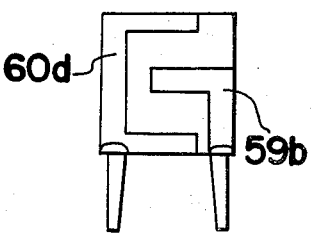
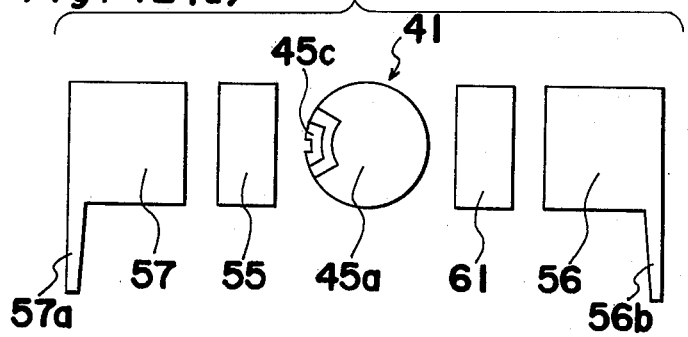
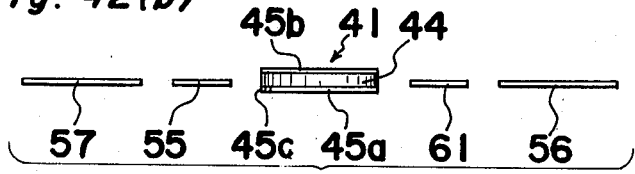
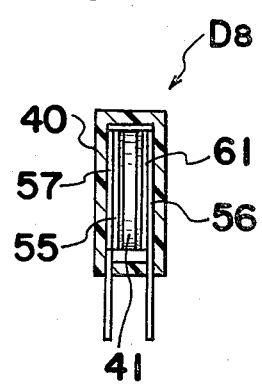

MODE SUPPRESSED PIEZOELECTRIC DEVICE

BACKGROUND OF THE INVENTION

The present invention relates to a piezoelectric device for use in filter, oscillators, and other electric circuits. More particularly, the present invention relates to an improvement in the assembly of the piezoelectric device.

Recently, in the field of electronics, many developments have been made to a technology of packaging integrated-circuit chips. However, there have been made little development on the technology of packaging piezoelectric elements alone or together with integrated-circuit chips.

From the viewpoint of external appearance, the package having a plurality of externally extending terminals aligned in one row along a side of the package is called a single-in-line package while the package having two rows of terminals one on each of opposite sides of the package is called a dual-in-line package. In general, all the packages having at least one row of terminals are called an in-line package.

Since a piezoelectric element produces mechanical vibration during operation, it has been a difficult task to rigidly support the piezoelectric element in the package without deteriorating its vibrating action.

Furthermore, since the piezoelectric element is considerably large in size compared with the integrated-circuit, it has also been a difficult task to render an electric connection between electrodes applied on the piezoelectric element and aligned terminals within the small size packages, particularly, when one or more piezoelectric elements are to be incorporated in one package.

It is a primary object of the present invention to provide a piezoelectric device which is compact in size, simple in construction and can readily be manufactured at low cost.

It is another object of the present invention to provide a piezolectric device of the above described type including a piezoelectric unit which suppresses the spurious mode.

It is a further object of the present invention to provide a piezoelectric device of the above described type which can easily support the piezoelectric unit without deteriorating its vibrating action.

It is a still further object of the present invention to provide a piezoelectric device of the above described type which operates in a stable condition regardless of the supporting pressure applied to the piezoelectric unit.

In accordance with a preferred embodiment of the invention, a piezoelectric device comprises a casing and at least one piezoelectric unit incorporated in the casing. The piezoelectric unit according to the present invention comprises a piezoelectric body having first and second flat surfaces disposed in parallel to each other. On the piezoelectric body, a first group of electrodes are laminated on the first surface except one peripheral portion, a second group of electrodes are laminated on the second surface, and an extended electrode are laminated on the one peripheral portion of the first surface in a separate relation to the first group of electrodes. A runner electrode is provided for connecting the second group of electrodes with the extended electrode. The piezoelectric device further comprises first and second attaching means rigidly held in the casing and attached to the first and second surfaces of the piezoelectric unit, respectively, for vibrantly supporting the piezoelectric unit. The electrodes of the first and second groups on the piezoelectric body are connected to first and second groups of terminal members, respectively. Each of the terminal members has a terminal leg extending outwardly from the casing for the external connection.

BRIEF DESCRIPTION OF THE DRAWINGS

The foregoing and other objects, features and advantages of the present invention will be apparent from the following description of the invention with reference to the accompanying drawings in which:

FIG. 7 is a circuit diagram of the piezoelectric device shown in FIG. 1;

FIGS. 8($a$) and 8($b$) are top and side-elevational views of a piezoelectric unit which is a modification of the piezoelectric unit shown in FIGS. 3($a$) to 3($c$);

FIGS. 9($a$) and 9($b$) are top and side-elevational views of a piezoelectric unit which is another modification of the piezoelectric unit shown in FIGS. 3($a$) to 3($c$);

FIGS. 10 and 11 are graphs showing attenuation characteristics of the piezoelectric device of the present invention and the prior art, respectively;

FIGS. 13($b$), 14($b$) and 15($b$) are schematic views showing waveforms produced in the piezoelectric unit according to the present invention;

FIG. 17 is an exploded side-elevational view showing elements incorporated in the piezoelectric device shown in FIG. 16;

FIG. 18 is a top plan view of elements shown in FIG. 17;

FIG. 20($b$) is a circuit diagram of the piezoelectric device shown in FIG. 16 with the application of additional connection;

FIGS. 38(a) to 38(c) are views similar to

FIGS. 32(a) to 32(c) but show a modification thereof;

FIGS. 40(a) to 40(c) are views similar to FIGS. 32(a) to 32(c) but show a further modification thereof;

FIGS. 41(a) and 41(b) are top and side-elevational views showing a modification of a terminal member incorporated in the piezoelectric device shown in FIGS. 40(a) to 40(c);

FIGS. 42(a) to 42(c) are views similar to FIGS. 32(a) to 32(c) but show a further modification thereof;

DETAILED DESCRIPTION OF THE INVENTION

Figure 1:
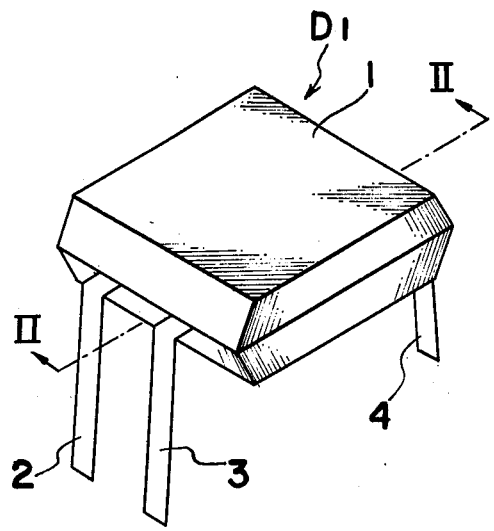
FIG. 1 is a perspective view of a piezoelectric device according to one embodiment of the present invention.

In the following description of the invention like parts are designated by like reference numerals throughout the accompanying drawings.

FIGS. 1 to 7 show, one embodiment of a piezoelectric device D1 according to the present invention. The piezoelectric device D1 of this embodiment is a dual-in-line type having, when viewed from top, a rectagular casing 1 and four terminal legs 2, 3, 4 and 5. The two terminal legs 2 and 3 are projecting out from one side of the reactangular casing 1 while the other terminal legs 4 and 5 are projecting from the opposite side of the casing 1, as best shown in FIG. 1.

Figure 2:
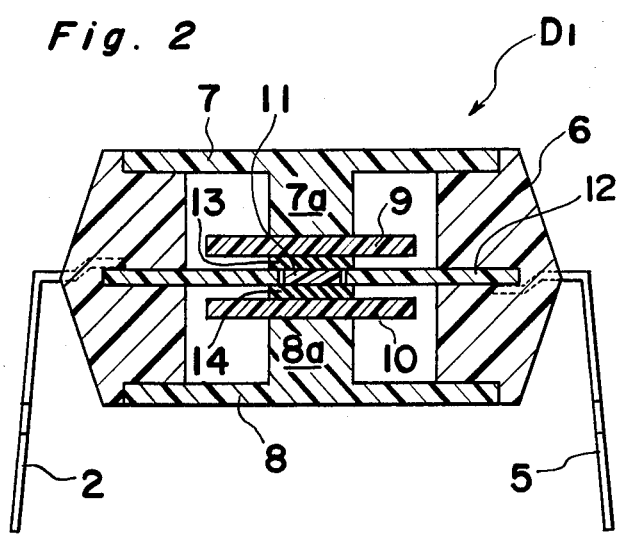
FIG. 2 is a cross-sectional view taken along a line II—II shown in FIG. 1.

Referring to FIG. 2, a cross sectional view of the piezoelectric device D1 is shown. The casing 1 includes a frame 6 constituting four sides of the casing 1, a top lid 7 and a bottom lid 8. The top lid 7 has a projection 7a projecting downwardly into the casing from the center of the lid 7. Similarly, the bottom lid 8 has a projection 8a projecting upwardly into the casing 1. A piezoelectric arrangement is held between the projections 7a and 8a. According to thid embodiment, the piezoelectric arrangement includes a first piezoelectric unit 9 positioned under the projection 7a and a second piezoelectric unit 10 positioned on the top of the projection 8a. These piezoelectric units 9 and 10 have the same structure and will be described in detail later in connection with FIGS. 3(a) to 3(c). The piezoelectric arrangement further includes a capacitor 11 inserted in an opening 12a formed in a base plate 12 rigidly held in the center of the casing 1 by the frame 6 and provided with printed electrodes which will be described later. Placed between the first piezoelectric unit 9 and the capacitor 11 is an anisotropic conduction pliable sheet such as a layer of rubber sheet 13 containing particles of electric conductive elements aligned in a thickness direction of the rubber sheet for allowing electric connection only in its thickness direction. One of this rubber sheet is known by an anisotropic conduction rubber sheet or one-directional conductive rubber sheet type AF which is a product of Shin-Etsu Polymer Co., Ltd. of Japan. A further characteristics of the rubber sheet is described in detail later in connection with FIGS. 37(a) to 37(c).

Figure 6:
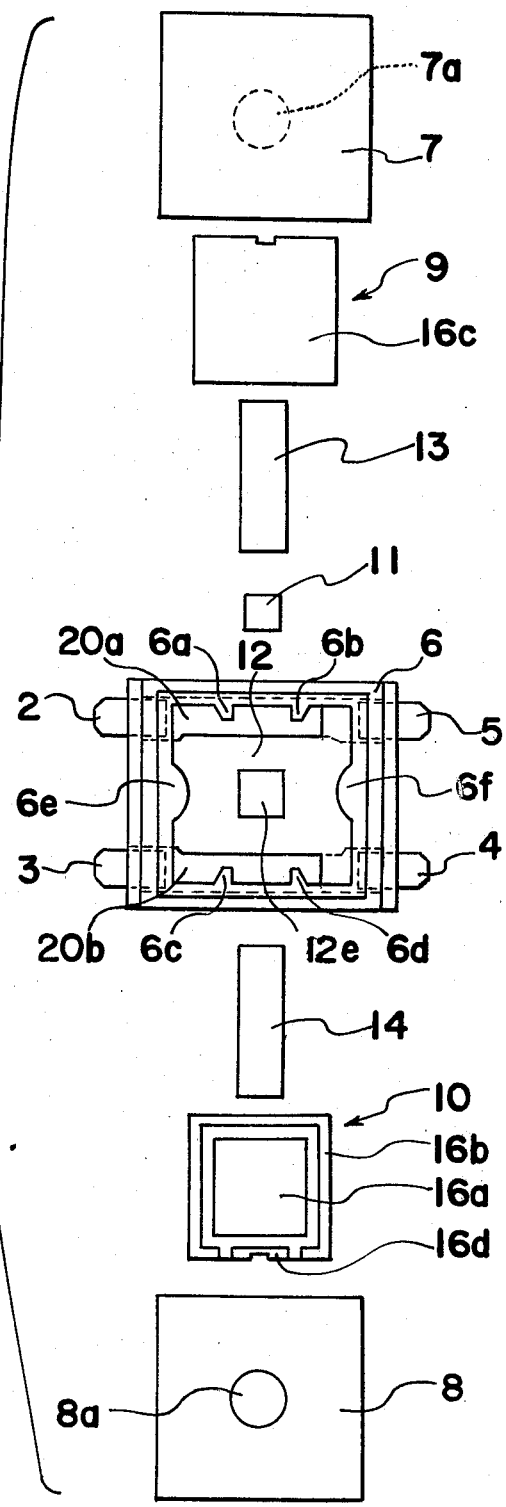
FIG. 6 is a top plan view of elements shown in FIG. 6.

These rubber sheets 13 and 14 are employed not only for the electrical connection between the electrodes on the piezoelectric unit and the electrodes on the base plate but also for absorbing the mechanical vibration of the piezoelectric unit. This rubber sheet 13 has a rectangular shape extending parallel to the direction of alignment of the terminal legs 2 and 3, as best shown in FIG. 6. Another rubber sheet 14 having the same feature as the rubber sheet 13 is placed between the capacitor 11 and the second piezoelectric unit 9.

Now the details of the piezoelectric unit 9 and 10 are described. Since the units 9 and 10 have the same structure, only the unit 9 is described in detail.

Figure 3A:
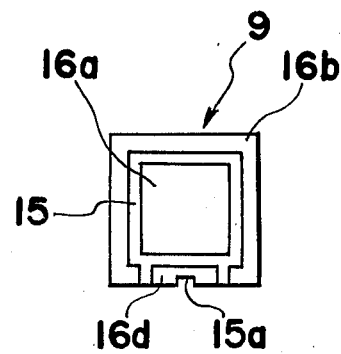
FIGS. 3($a$), 3($b$) and 3($c$) are top plan view, bottom plan view and side-elevational view of a piezoelectric unit according to the present invention.
Figure 3B:
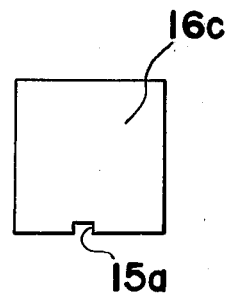
Figure 3C:
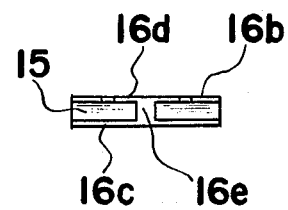

Referring to FIGS. 3(a) to 3(c), the piezoelectric unit 9 comprises a piezoelectric body 15 of a square shape and three electrodes laminated on the body 15 by any known manner, such as, printing, baking, plating, sputtering, deposition, etching, etc. The first electrode, namely a center electrode 16a, is laminated on the center portion of a first surface of the body 15. The second electrode, namely a rim electrode 16b, is laminated on the body 15 at a location which is adjacent all but a central portion of one side edge of the first surface of the body 15. The third electrode 16c is laminated on the entire surface of a second surface of the body 15 (FIG. 3(b)). A section of the rim electrode 16b is separated from the rest of the rim electrode 16b by a suitable gap. This section of the separated rim electrode, referred to as an extended electrode 16d hereafter, is connected to the third electrode 16c through a suitable runner electrode 16e. According to a preferred embodiment, the runner electrode 16e extends along a groove 15a formed in one side of the piezoelectric body 15 . The above described piezoelectric unit, namely, three electrode type piezoelectric unit, functions as a resonator particularly for use in filters. When the piezoelectric unit of this construction is excited and vibrated primarily in the breathing mode, spurious vibrations are dampened. See FIG. 13(b) and the discussion below.

Since all the electrodes on the piezoelectric unit 9 appear on its first surface, the necessary electric connection can be carried out in the first surface.

Figure 4A:
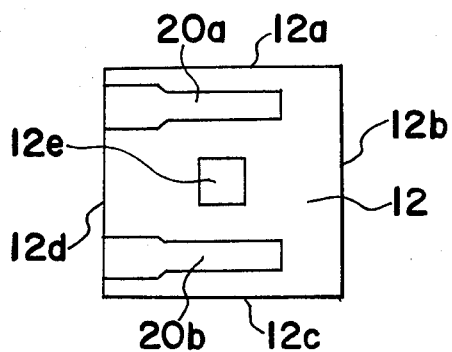
FIGS. 4($a$) and 4($b$) are top and bottom plan views of a base plate mounted in a casing of the piezoelectric device shown in FIG. 1.
Figure 4B:
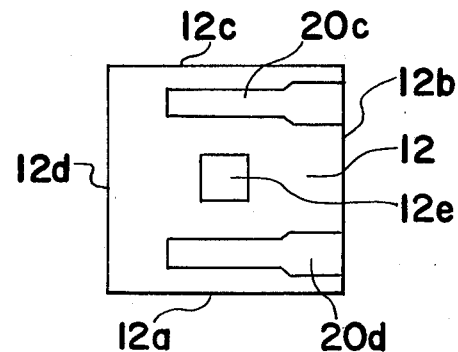
Figure 14A:
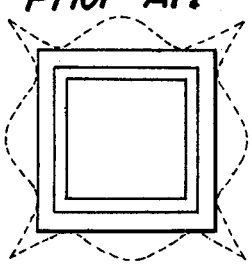
Figure 14B:
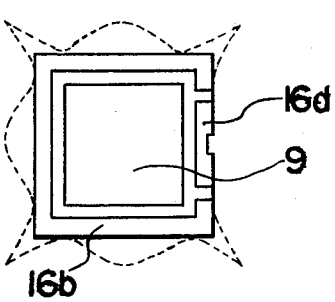

Referring to FIGS. 4(a) and 4(b), the base plate 12 according to this embodiment is made of non-conductive material and has four sides 12a, 12b, 12c and 12d. One flat surface of the base plate 12 has two elongated printed electrodes 20a and 20b which are made of copper wafer and are aligned parallel to each other and positioned close to the sides 12a and 12c, respectively, as shown in FIG. 4(a). The application of the electrodes on the base plate 12 can be carried out not only by the method of printing but also other known methods, such as, baking, plating sputtering, deposition and etching, can be used. One end of the respective electrodes 20a and 20b terminates at the side 12d while the other end terminates at the intermediate portion close to the opposite side 12b. In a similar manner, two elongated electrodes 20c and 20d are printed on the other flat surface of the base plate 12, as shown in FIG. 14(b). The central opening 12e is provided for inserting the capacitor 11.

Figure 5:
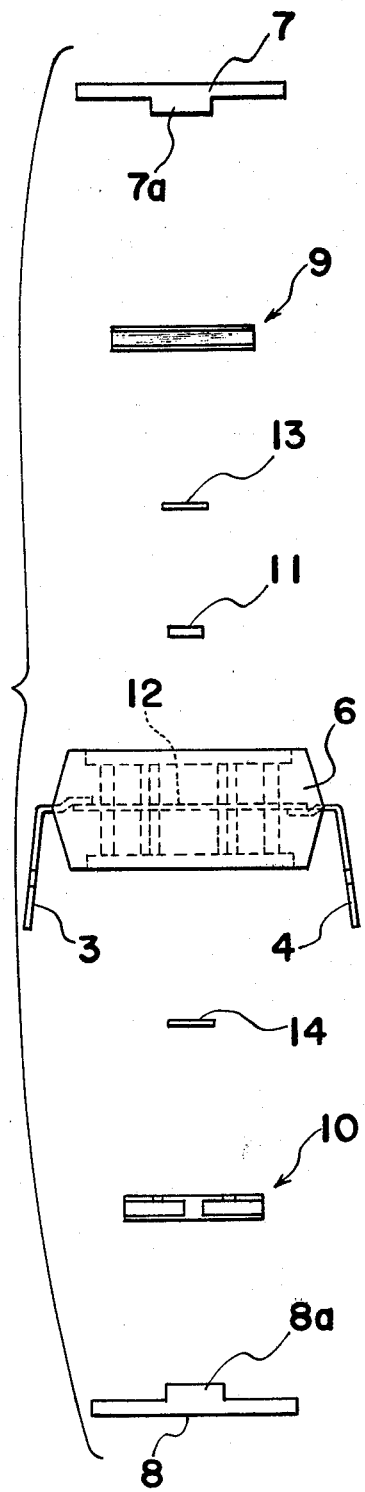
FIG. 5 is an exploded side-elevational view showing elements incorporated in the piezoelectric device shown in FIG. 1.

Referring to FIGS. 5 and 6, the manner in which the constructing parts are incorporated in the package or casing is described. First, the terminal legs 2, 3, 4 and 5 are soldered to the electrodes 20a, 20b, 20c and 20d, respectively. Then, the frame 6, which is originally separated into upper and lower portions, is applied for holding the base plate 12 and for defining upper and lower compartments in the frame 6. Then, the capacitor 11 having approximately the same thickness as that of the base plate 12 is placed into the opening 20e. Thereafter, in the upper compartment, the rubber sheet 13 is placed across the base plate 12 in such a manner that the center portion of the rubber sheet 13 covers at least a part of the capacitor 11 and the opposite end portions of the rubber sheet 13 cover the respective two electrodes printed on the base 12. According to a preferable embodiment, the frame 6 is provided with four projections 6a, 6b, 6c and 6d for determining the position of the rubber sheet 13. The first piezoelectric unit 9 is placed on the rubber sheet 13 with the first surface of the unit 9 facing the rubber sheet 13 for allowing the electrical connection through the rubber sheet 13 between the electrodes in the unit 9 and the electrodes on the base plate 12 and the capacitor 11. More particularly, the center electrode 16a of the unit 9 is connected through the rubber sheet 13 to the capacitor 11, the rim electrode 16b is connected through the rubber sheet 13 to the printed electrode 20b, and the extended electrode 16d is connected through the rubber sheet 13 to the printed electrode 20a. Since the rubber sheet 13 allows the electrical connection only in its thickness direction, no electrical connection will be established other than those described above. For determining the position of the piezoelectric unit 9, it is preferable to provide projections 6e and 6f in the frame 6. The top lid 7 is placed on the piezoelectric unit 9 with the peripheral edge portion of the lid 7 bonded to the frame 6 for sealing the upper compartment and for supporting the piezoelectric unit 9 by the projection 7a. Since the projection 7a supports the center of the piezoelectric units 9 where the mode exists, the piezoelectric unit 9 can be vibrated without any hindrance. The lower compartment is constructed in a similar manner to the upper compartment. FIG. 7 shows a circuit diagram of the piezoelectric device D1.

It is to be noted that the connection between the extended electrode 16d and the third electrode 16c can be effected without forming any grooves as shown in FIGS. 8(a) and 8(b), or by a runner electrode extending through a hole 15b formed in the piezoelectric body 15 as shown in FIGS. 9(a) and 9(b).

Figure 12A:
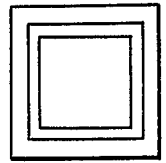
FIGS. 12($a$) to 12($c$) are top, side elevational and bottom plan views of the piezolectric unit of the prior art.
Figure 12B:
Figure 12C:
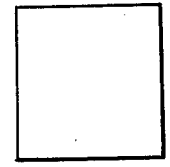

In the above arrangement, it has been found by the present inventors that the application of extended electrode 16d on the first surface advantageously suppresses the spurious mode in the output signal from the piezoelectric unit 9. A graph of FIG. 10 shows spurious mode characteristics of the piezoelectric unit 9 according to the present invention with a central frequency at 455 KHz, while a graph of FIG. 11 shows a spurious mode characteristic of the prior art piezoelectric unit with the same central frequency. As shown in FIGS. 12(a) to 12(c), the piezoelectric unit of the prior art has no extended electrode. It is understood from the graphs of FIGS. 10 and 11 that the spurious modes in the frequency region of 1 to 2 MHz are suppressed when the piezoelectric unit according to the present invention is employed.

Figure 13A:
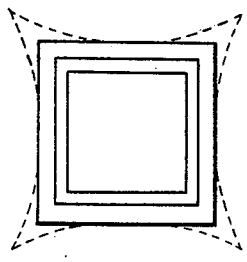
FIGS. 13($a$), 14($a$) and 15($a$) are schematic views showing waveforms produced in the piezoelectric unit of the prior art.
Figure 13B:
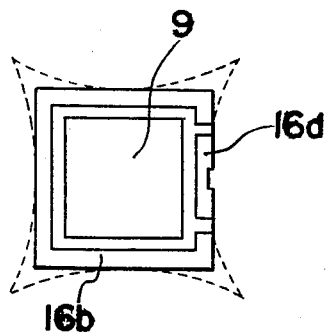
Figure 15A:
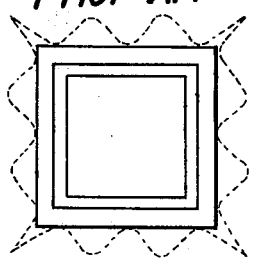
Figure 15B:
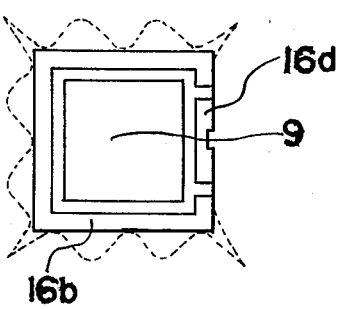
Figure 16:
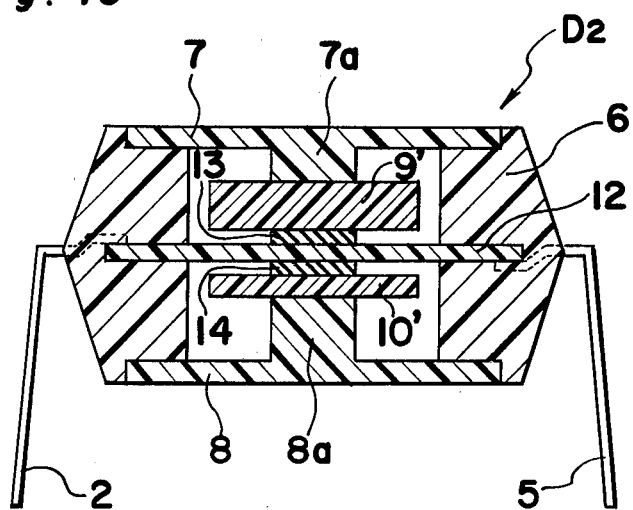
FIG. 16 is a cross-sectional view showing a modification of the piezoelectric device shown in FIG. 2.

Although it is not clear why the piezoelectric unit according to the present invention suppresses the spurious modes, it appears that the extended electrode 16d attenuates the loop of the vibrations caused by the spurious modes. Broken lines in FIGS. 13(a) and 13(b) show a waveform of dominant mode (breathing mode) at a particular moment in the prior art piezoelectric unit and that of the present invention, respectively. Similarly, broken lines in FIGS. 14(a) and 14(b) show a waveform of third harmonic, and broken lines in FIGS. 15(a) and 15(b) show a waveform of fifth harmonic. These FIGS. 13(a) to 15(b) show a manner in which the extended electrode 16d attenuates the vibration of spurious modes.

Furthermore, since the electrodes on the piezolectric units 9 and 10 are gathered on one of its opposite surfaces, the arrangement of the piezoelectric device according to the present invention has such advantages that the electrical connection between the piezoelectric unit and various parts in the device can be carried out easily and that the device can be prepared in a compact size.

FIGS. 16 to 20(b) show a modification of the piezoelectric device D1 described above. Since a piezoelectric device D2 of this modification has a similar structure to that of the device D1, only the difference between the devices D1 and D2 is described.

First of all, the piezoelectric device D2 has no capacitor 11 which has been described in connection with the device D1 inserted into the base plate 12. Therefore, the base plate 12 is not provided with any openings.

Each of piezoelectric units 9' and 10' has two electrodes, as shown in FIG. 18, instead of three. The first electrode 16a' is laminated on the first surface of the piezoelectric body 15 together with the extended electrode 16d', and the second electrode 16b' is entirely laminated on the second surface of the body 15. The runner electrode 16e' is laminated on the side surface of the body 15 where it is recessed, for electrically connecting the second electrode 16b' and the extended electrode 16d' together. The above described piezoelectric unit, namely two electrode type piezoelectric unit, functions as a resonator particularly for use in oscillators and ladder filters. It is needless to say that the extended electrode 16d' suppresses the spurious mode. Since the piezoelectric unit 9' is a series connected element, as apparent from FIG. 20(a), the piezoelectric unit 9' can be arranged to have a larger capacitance than the piezoelectric unit 10' which is a parallel connected element. To achieve this arrangement, the piezoelectric body 15 of the unit 9' is prepared thicker than that of the unit 10', and/or the first electrode 16a' of the unit 9' is laminated only in the center portion of the first surface of the body 15.

Figure 19A:
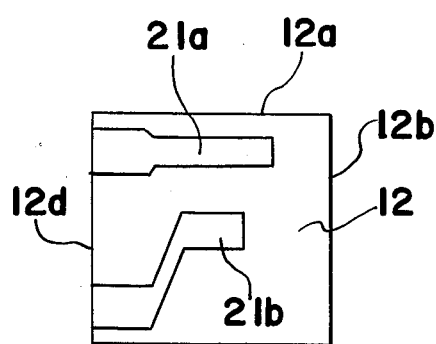
FIGS. 19($a$) and 19($b$) are top and bottom plan views of a base plate mounted in a casing of the piezoelectric device shown in FIG. 16.
Figure 19B:
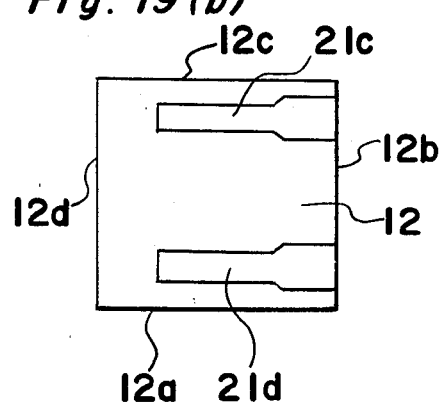

Referring to FIGS. 19(a) and 19(b), the base plate 12 has four electrodes 21a, 21b, 21c and 21d printed in a similar manner to the printed electrodes shown in FIGS. 4(a) and 4(b), except one printed electrode 21b which extends towards the center of the plate 12. This electrode 21d is useful particularly in the case where the piezoelectric unit 9' has a small size electrode laminated at the center of the piezoelectric body 15 for increasing the capacitance.

Figure 20A:
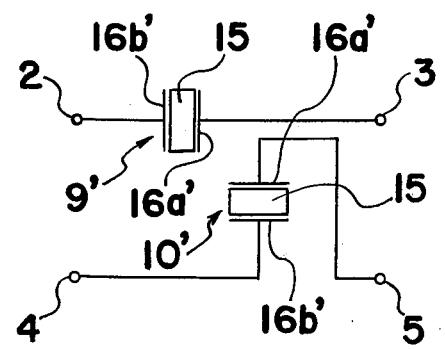
FIG. 20($a$) is a circuit diagram of the piezoelectric device shown in FIG. 16.

Next, the connection between the electrodes in the base plate 12 and the terminal legs is described. In FIG. 18, when the piezoelectric unit 9' is placed on the first surface of the base plate 12 through the rubber sheet 13, the first electrode 16a' of the unit 9' is connected through the rubber sheet 13 to the printed electrode 21b which is in turn connected to the terminal leg 3 while the second electrode 16b' is connected through the runner electrode 16e', extended electrode 16d' and rubber sheet 13 to the printed electrode 21a which is in turn connected to the terminal leg 2. Similarly, when the piezoelectric unit 10' is placed on the second surface of the base plate 12 through the rubber sheet 14, the first electrode 16a' of the unit 10' is connected to the terminal leg 5 while the second electrode 16b' of the unit 10' is connected to the terminal leg 4. A circuit diagram of the above arrangement is shown in FIG. 20(a).

Figure 20B:
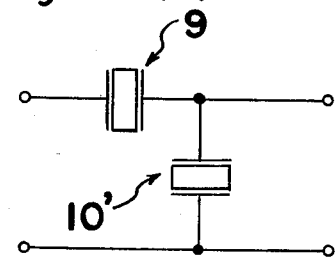

However, if the terminal legs 3 and 5 are connected together either internally or externally of the casing 1, the piezoelectric device D2 forms a ladder filter circuit as shown in FIG. 20(b). In the case where the ladder circuit is formed by the internal connection, the printed electrode 21d is connected to the printed electrode 21b instead of the terminal leg 5 and the printed electrode 21c is connected to the terminal leg 5 in addition to the terminal leg 4.

FIGS. 21 to 25(b) show a piezoelectric device D3 which is another modification of the piezoelectric device D1 described above.

Figure 21:
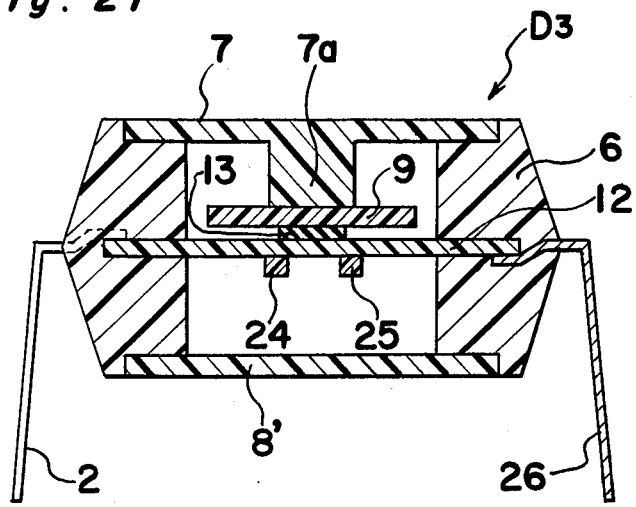
FIG. 21 is a cross-sectional view showing another modification of the piezoelectric device shown in FIG. 2.
Figure 23:
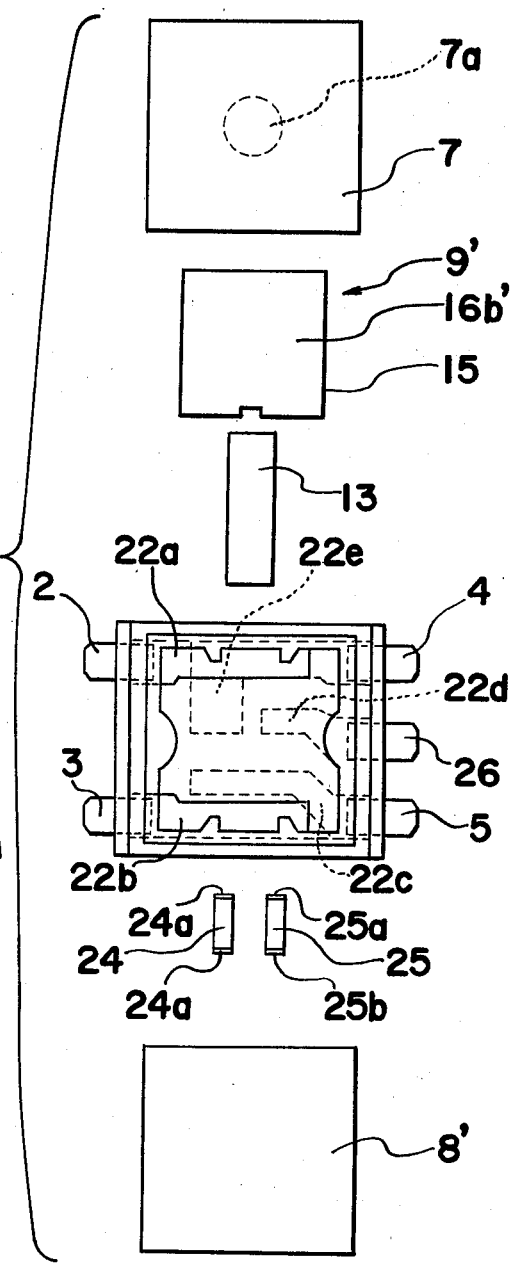
FIG. 23 is top plan view of elements shown in FIG. 22.

Referring particularly to FIG. 21, the piezoelectric device D3 has the three electrode type piezoelectric unit 9 supported in the upper compartment in a similar manner to that described above and has two chips of capacitors 24 and 25 in the lower compartment instead of the piezoelectric unit 10. The capacitor 24 has a rectangular shape and its terminals 24a and 24b are provided at opposite ends. The capacitor 25 has the same structure as the capacitor 24 and has terminals 25a and 25b at opposite ends, as best shown in FIG. 23. The pattern of the printed electrodes on the base plate 12 is shown in FIGS. 24(a) and 24(b).

Figure 24A:
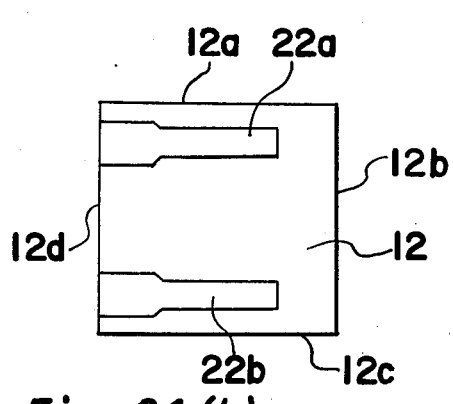
FIGS. 24(a) and 24(b) are top and bottom plan views of a base plate mounted in a casing of the piezoelectric device shown in FIG. 21.
Figure 24B:
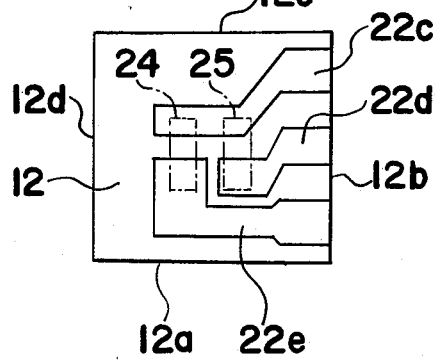

The base plate 12 has two printed electrodes 22a and 22b on its first surface, as shown in FIG. 24(a), and three printed electrodes 22c, 22d and 22e on the second surface, as shown in FIG. 24(b). The positions at which the capacitors 24 and 25 are placed are shown by a chain line. The capacitors 24 and 25 are attached at the respective places by means of electrically conductive bonding agent or by soldering for connecting the terminals 24b and 25b to the printed electrode 22c on the base plate 12 and for connecting the terminals 24a and 25a to the printed electrodes 22e and 22d, respectively.

Since the base plate 12 has five printed electrodes, the casing 1 has five terminal legs. The two terminal legs 2 and 3 are projecting from one side of the casing 1 and are connected to the printed electrodes 22a and 22b, respectively. The remaining three terminal legs 4, 26 and 5 are projecting from the opposite side of the casing 1 and are connected to the printed electrodes 22e, 22d and 22c, respectively.

Figure 25A:
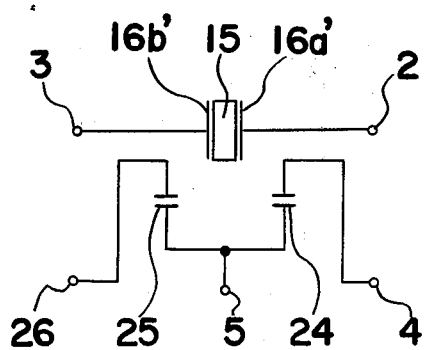
FIG. 25(a) is a circuit diagram of the piezoelectric device shown in FIG. 21.

Next, the connection between the electrodes in the base plate 12 and the terminal legs is described. In FIG. 23, when the two electrode type piezoelectric unit 9' is placed on the first surface of the base plate 12 through the rubber sheet 13, the first electrode 16a' of the unit 9' is connected through the rubber sheet 13 to the printed electrode 22a which is in turn connected to the terminal leg 2, while the second electrode 16b' is connected through the runner electrode 16e', extended electrode 16d' and the rubber sheet 13 to the printed electrode 22b which is in turn connected to the terminal leg 3. When the capacitors 24 and 25 are attached to the base plate 12 in the manner described above, the capacitor 24 will be connected between the terminal legs 4 and 5 while the capacitor 25 will be connected between the terminal legs 26 and 5. Since no piezoelectric unit is incorporated in the lower compartment, the lower lid 8' is made of plain square plate. A circuit diagram of the above arrangement is shown in FIG. 25(a).

Figure 25B:
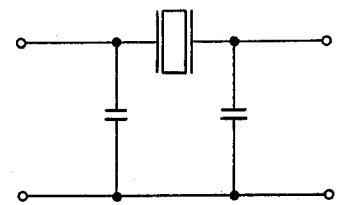
FIG. 25(b) is a circuit diagram of the piezoelectric device shown in FIG. 21 with the application of additional connection.
Figure 22:
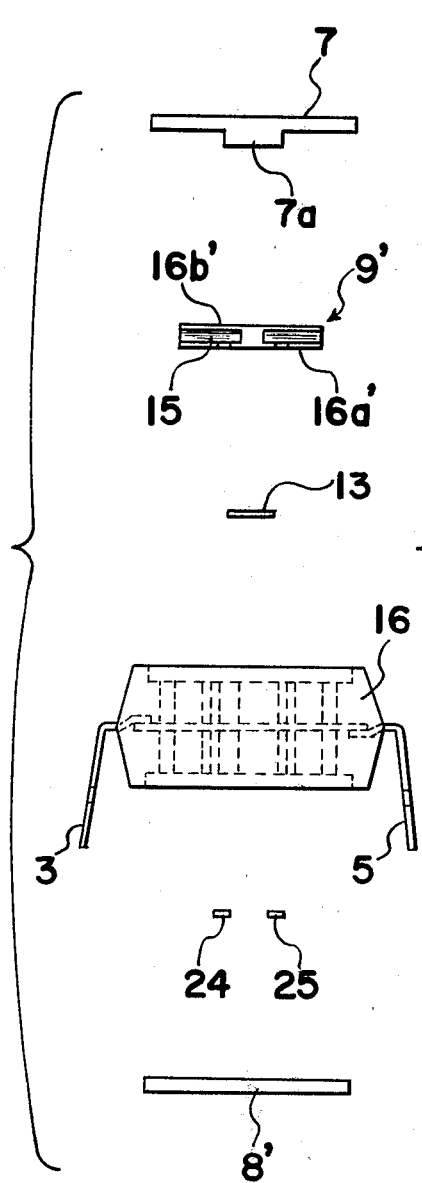
FIG. 22 is an exploded side-elevational view showing elements incorporated in the piezoelectric device shown in FIG. 21.

When the terminal legs 3 and 26 are connected with each other and, at the same time the terminal legs 2 and 4 are connected with each other, a part of feedback circuit for use in an oscillator is established, as shown in FIG. 25(b). The above connections can be effected either internally or externally of the casing 1. For obtaining the circuit shown in FIG. 25(b), it is possible to arrange the printed electrode pattern so that the electrodes 24a and 25a of the capacitors 24 and 25 are, respectively, connected to the electrodes 16a' and 16b' of the piezoelectric unit 9' in the casing 1 while the other electrodes 24b and 25b are connected with each other and in turn to the terminal leg 5. In this case, it is not necessary to provide terminal legs 4 and 26, and preferably, the terminal leg 5 should be bifurcated. It is needless to say that the other arrangements can be accepted.

Although the above modifications are directed to the case where the casing 1 contains only one or two piezoelectric units, it is possible to include more piezoelectric units. In this case, it is preferable to enlarge the base plate and to arrange the added piezoelectric units in side-by-side relation to the ones already applied to the base plate 12. Furthermore, operating frequency of the piezoelectric units can be different from each other. For example, one piezoelectric unit may operate at 455 KHz while another piezoelectric unit may operate at 10.7 MHz. The configuration of the piezoelectric unit can be other than square such as circle.

Moreover, the base plate can be designed to support a chip of integrated circuit which can be interconnected with the piezoelectric unit within the casing 1, and the terminal legs can be aligned only on one side of the casing for forming a single-in line package instead of dual-in line package.

Since the piezoelectric device of the above described embodiment can be arranged in a compact size with a similar appearance to the conventional package or device of integrated circuit elements, the piezoelectric device of the above described embodiment can be automatically mounted on a substrate or printed base plate by the use of conventional mounting apparatus.

Referring to FIGS. 26 to 31, there is shown manufacturing steps for producing numbers of piezoelectric devices, particularly, the device D1.

Figure 26:
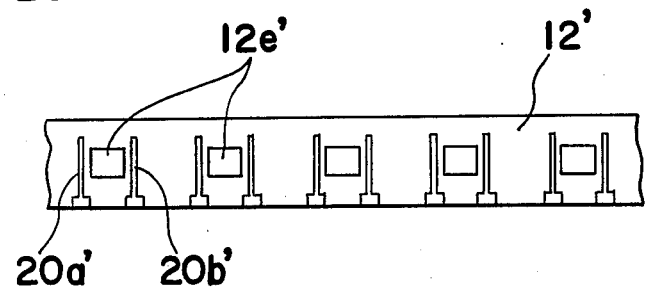
FIG. 26 is a top plan view of a belt which constitutes a plurality of base plates of the piezoelectric device shown in FIG. 2.

First, a strip 12' of electrically non-conductive material is formed with a plurality of openings 12e' with a predetermined pitch along a lengthwise direction and two elongated electrodes 20a' and 20b' are laminated on one surface one on each side of the respective opening 12e' with one end terminating at lower side edge of the strip and the other end terminating at a position close to the upper side edge of the strip, as shown in FIG. 26. Similar elongated electrodes are laminated on the other surface of the strip 12' but its one end terminates at the upper side edge while the other end terminates at a position close to the lower side edge.

Figure 27:
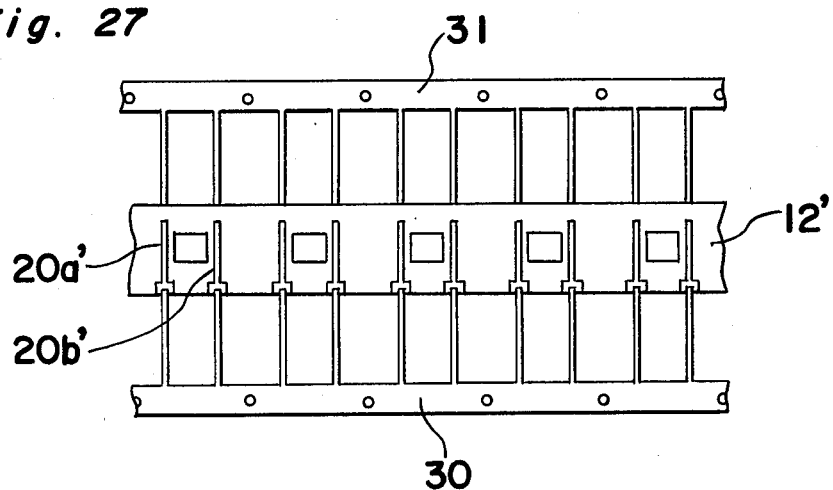
FIG. 27 is a top plan view of the belt provided with terminal leg forming belt.

Referring to FIG. 27, a comb shaped metallic belt 30 having a plurality of projections extending from a body portion is attached to the strip 12' in such a manner that the free end of each projection is soldered to the electrodes 20a' and 20b'. Similarly, another comb shaped metallic belt 31 is attached to the strip 12' for electrically connecting the free ends of the projections to the electrodes laminated on the other side of the strip 12'.

Figure 28:
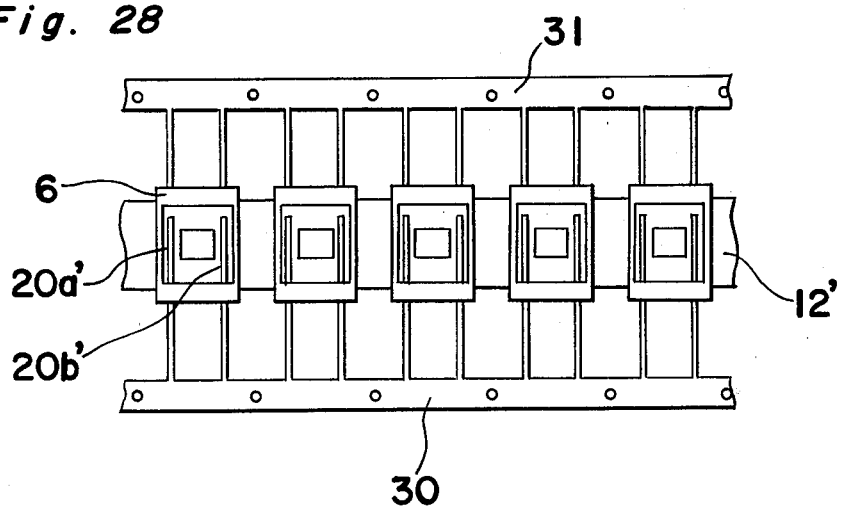
FIG. 28 is a top plan view of the belt further provided with frame members for constituting the casing.

Referring to FIG. 28, an upper portion of the frame 6 is mounted on strip 12' for enclosing each section including the opening 12e' and laminated electrodes 20a', 20b' on opposite sides of the opening 12e'.

Figure 29:
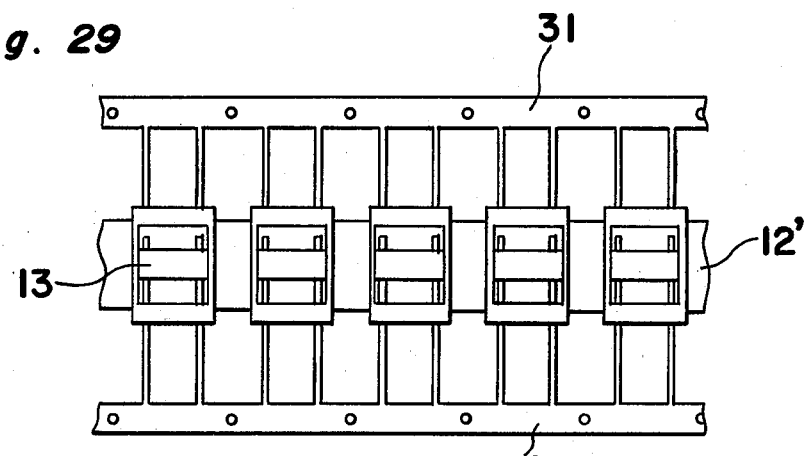
FIG. 29 is a top plan view of the belt further provided with rubber sheet in each frame.
Figure 30:
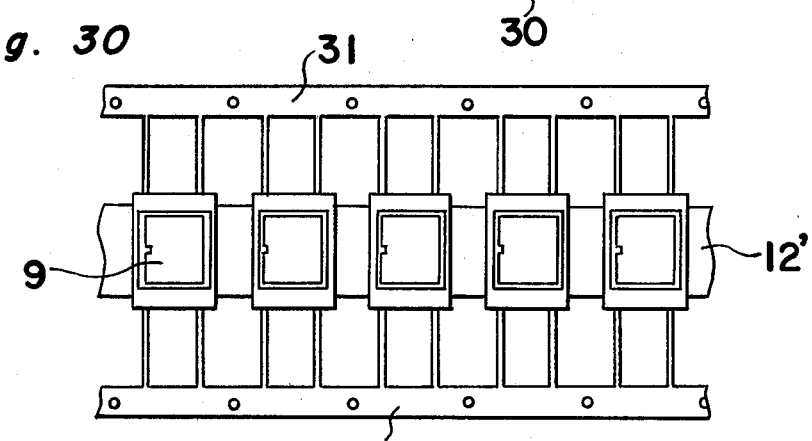
FIG. 30 is a top plan view of the belt further provided with piezoelectric unit in each frame.
Figure 31:
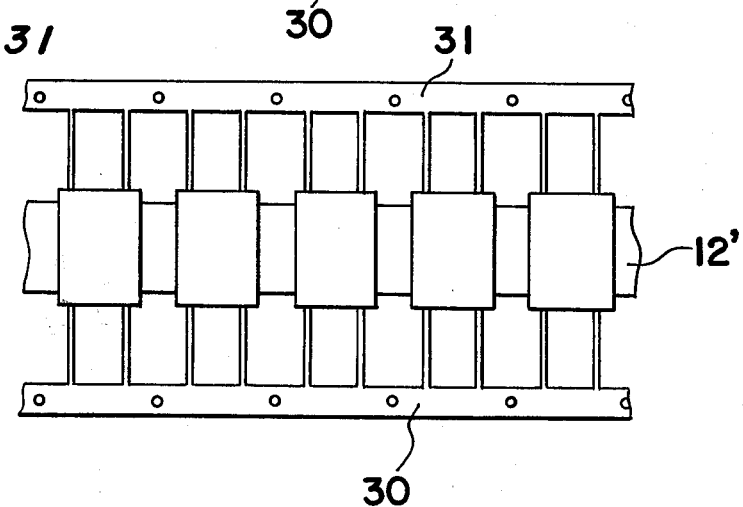
FIG. 31 is a top plan view of the belt further provided with lid on each frame.

Thereafter, a rubber sheet is placed across the two electrodes 20a', 20b', as shown in FIG. 29, and then, the piezoelectric unit 9 is placed, as shown in FIG. 30. Next, the top lid 7 is bonded for enclosing the upper compartment.

Then the capacitor 11 is inserted in each opening and similar steps as described above are taken for forming the lower compartment. After the parts are combined, the body portions of the comb shaped metallic plates 30 and 31 are cut off for forming terminal legs and the strip 12' is cut at side edges of the frame for forming individual piezoelectric devices.

Figure 32A:
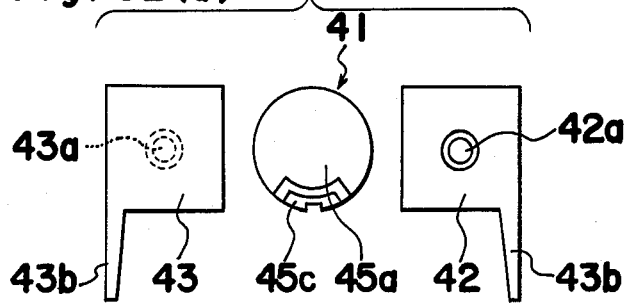
FIGS. 32(a) and 32(b) are top plan view and side-elevational view of exploded parts of piezoelectric device according to the second embodiment of the present invention.
Figure 32B:
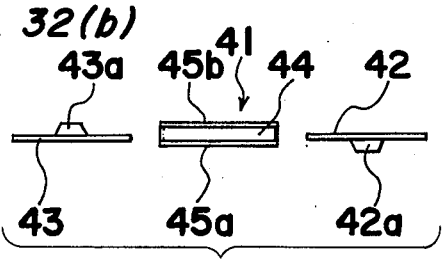
Figure 32C:
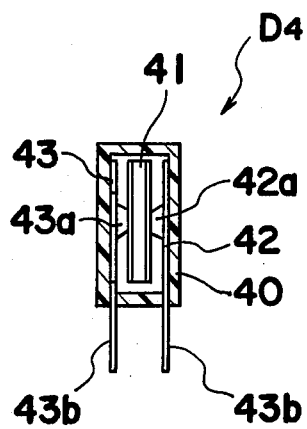
FIG. 32(c) is a side-elevational view partly broken of the piezoelectric device according to the second embodiment.

Referring to FIGS. 32(a) to 32(c), there is shown a piezoelectric device D4 which is a second embodiment of the present invention. The piezoelectric device D4 includes a casing 40, a two electrode type piezoelectric unit 41 having a disc shape, and two terminal members 42 and 43 made of electrically conductive material. The terminal member 42 is made of a square metal plate having a projection 42a at its center and a terminal leg 42b extending downwardly from one side of the plate. Similarly, the terminal member 43 has a projection 43a and terminal leg 43b. The piezoelectric unit 41 includes a disc shaped piezoelectric body 44, a first electrode 45a laminated on one flat surface (first surface) of the body 44 except one peripheral portion, a second electrode 45b laminated entirely on the other flat surface (second surface) of the body 44, an extended electrode 45c laminated on the one peripheral portion of the first surface in separate relation to the first electrode 45a and a runner electrode (not shown) laminated on the side of the body 44 for connecting the second electrode 45b and the extended electrode 45c together. It is preferable to form a groove as shown in the side of the body 44 in the axial direction and laminating the runner electrode in the groove.

It is to be noted that the extended electrode supresses the spurious mode in the manner described above.

When the piezoelectric unit 41 and the terminal members 42 and 43 are incorporated in the casing 40, the terminal legs 42a and 43a project outwardly from the casing 40 for the external connection, and the piezoelectric unit 41 is held between the projections 42a and 43a at its center where the node of vibration exists. When a particular signal is applied between the terminal legs 42a and 43a, the piezoelectric unit 41 may vibrate freely without any hindrance.

Figure 33A:
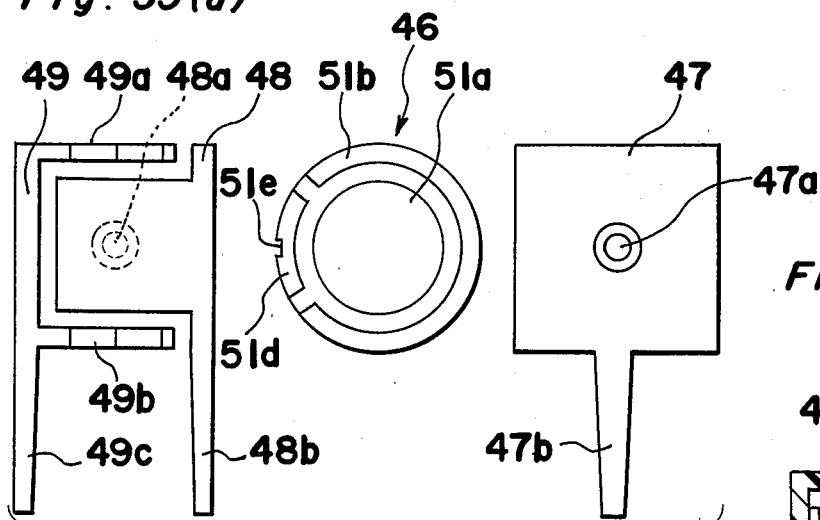
FIGS. 33(a), 33(b) and 33(c) are views similar to FIGS. 32(a), 32(b) and 32(c) but show a modification thereof.
Figure 33B:
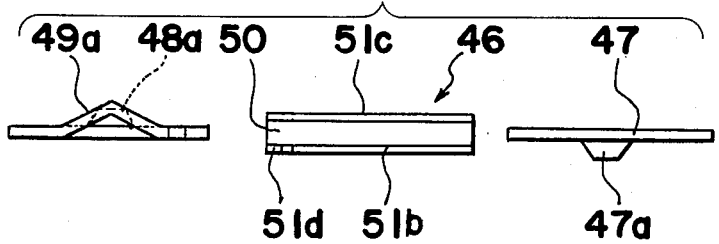
Figure 33C:
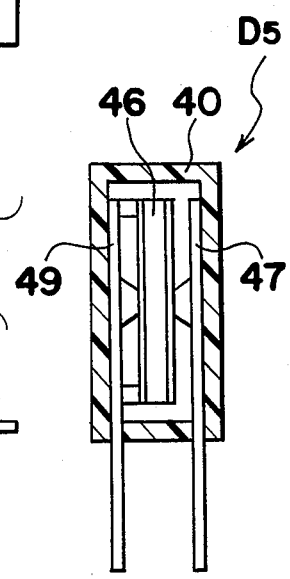

Referring to FIGS. 33(a) to 33(c), there is shown a piezoelectric device D5 which is a modification of the device D4. The piezoelectric device D5 includes the casing 40, a three electrode type piezoelectric unit 46 having a disc shape, and three terminal members 47, 48 and 49 which are made of electrically conductive material. The piezoelectric unit 46 includes a disc shaped piezoelectric body 50, a first electrode 51a laminated on center portion of one flat surface (first surface) of the body 50, a second electrode 51b laminated on peripheral edge portion of the first surface except one peripheral portion, a third electrode 51c laminated entirely on the other flat surface (second surface) of the body 50, an extended electrode 51d laminated on the one peripheral portion of the first surface in separate relation to the first and second electrodes 51a and 51b, and a runner electrode 51e laminated on the side of the body 50 for connecting the third and extended electrodes 51c and 51d. The runner electrode 51e is provided in a groove formed in the body 50.

The terminal member 47 made of square metal plate has a projection 47a in its center and terminal leg 47b. The terminal member 48 has a square plate with a projection 48a in its center and terminal leg 48b extending from one side of the square plate. The terminal member 49 has two parallel arms 49a and 49b and a terminal leg 49c which are arranged in "F" shape. The arms 49a and 49b are bent in the shape of bow.

When the piezoelectric unit 46 and the terminal member 47, 48 and 49 are incorporated in the casing 40, the terminal legs 47a, 48a and 49a project outwardly from the casing 40 and the piezoelectric unit 46 is held between the projections 47a and 48a at its center where the node of vibration exists. The bow shaped arms 49a and 49b are held in contact with the second electrode 51b. Since the piezoelectric unit 46 of this modification has a larger diameter than the above described piezoelectric unit 41, the portions where the second electrode 51b contact with the arms 49a and 49b are the nodes of vibration. This feature is explained in detail below.

Figure 34A:
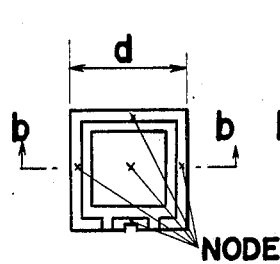
FIGS. 34(a) to 36(b) are explanatory views showing positions of nodes of vibration and mode of vibration in each piezoelectric unit.
Figure 34B:

Referring to FIGS. 34(a) and 34(b), in the case where the piezoelectric unit has a square configuration, the nodes of vibration exist at the center of the unit and also at the center of each side. In other words, the square piezoelectric unit has five vibration nodes. Therefor, so long as the piezoelectric unit is held at the nodes the unit may vibrate freely without any hindrance.

Figure 35A:
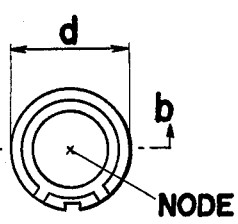
Figure 36A:
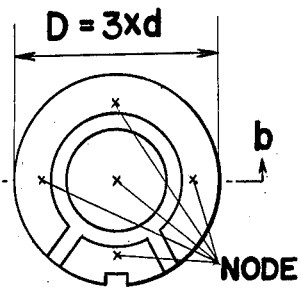
Figure 35B:
Figure 36B:

Referring to FIGS. 35(a) and 35(b), in the case where the piezoelectric unit has a circle configuration with the fundamental frequency being adopted as a central frequency, the node of vibration exists only at the center of the unit. Therefore, this type of piezoelectric unit can be held only at the center of the unit. However, if the third harmonics is adopted as a central frequency and the size of the diameter is increased three times, the node of vibration appears, besides at the center, at four different points which are positioned $\frac{1}{3}$D (D is diameter of the large size piezoelectric unit) off from the center of the unit and separated from each other at right angle about the center. These four points exist in the second or rim electrode. Therefore, in the case where the circle piezoelectric unit of the three electrode type is employed in the device, the rim electrode can be held in contact with terminal members at such nodes so as to ensure the electric contact and to allow free vibration of the unit. However, with such arrangement, it is inevitable that the size of the device may become large as shown in FIGS. 33(a) to 33(c). From this aspect, it is preferable to use a flexible material which electrically connects the electrodes on the piezoelectric unit with respective terminal members and, at the same time, absorbs the vibration for effecting free vibration of the unit, so that the small size piezoelectric unit can be used even for the three electrode type piezoelectric unit.

For this purpose, an isotropic conduction pliable sheet, anisotropic conduction pliable sheet or pressure conduction pliable sheet is employed between the piezoelectric unit and the corresponding terminal member. The isotropic conduction pliable sheet is an elastic sheet which contains particles of electric conductive material aligned at random for effecting electric conduction in all directions as in metal sheet. The anisotropic conduction pliable sheet is an elastic sheet which contains particles of electric conductive material aligned in a predetermined direction across its thickness direction for effecting electric conduction only in the thickness direction. The pressure conduction pliable sheet is an elastic sheet which establishes an electric conduction in its thickness direction at a point where a predetermined or higher pressure is applied. Since these three types of sheets are known in the prior art, a further description is omitted.

Figure 38A:
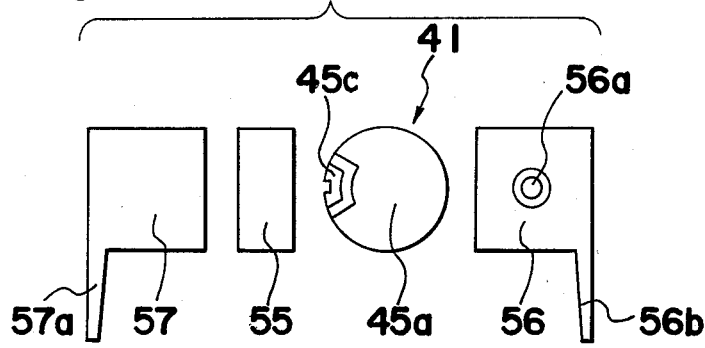
Figure 38B:
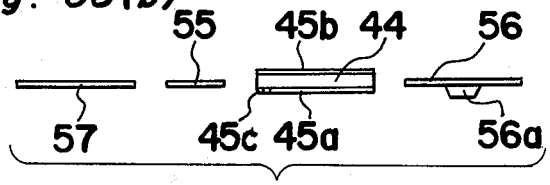
Figure 38C:
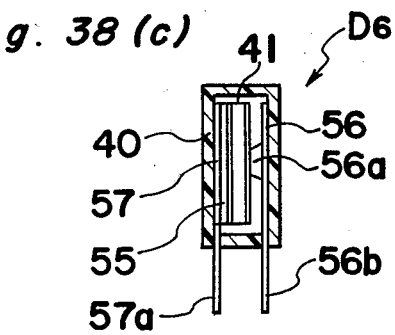

The isotropic conduction pliable sheet is suitable particularly when only single connection is required between one surface of the piezoelectric unit and corresponding terminal member, such as in a device D6 shown in FIGS. 38(a) to 38(c). Whereas the anisotropic conduction pliable sheet or pressure conduction pliable sheet is suitable not only for the single connection as described above but also for two or more connections required between one surface of the piezoelectric unit and corresponding terminal members, such as in a device D7 shown in FIGS. 40(a) to 40(c). Since the anisotropic conduction pliable sheet and the pressure conduction pliable sheet have the same characteristics, they are generally referred to as a "direction-oriented electroconductive pliable sheet". According to a preferable embodiment, the rubber sheet having an anisotropic conduction characteristics is used although other types can be used. It is to be noted that the term "rubber sheet" used hereinabove and hereinbelow means a rubber sheet having an anisotropic conduction characteristics.

Since the rubber sheet can support the piezoelectric unit at points other than nodes, that is, where the unit is vibrating, it is possible to hold three electrode type piezoelectric unit of small size.

In addition to above, the employment of the rubber sheet has such an advantage that the resonance frequency and resistance of the piezoelectric unit will become stable regardless of pressure applied for supporting the unit.

Figure 37A:
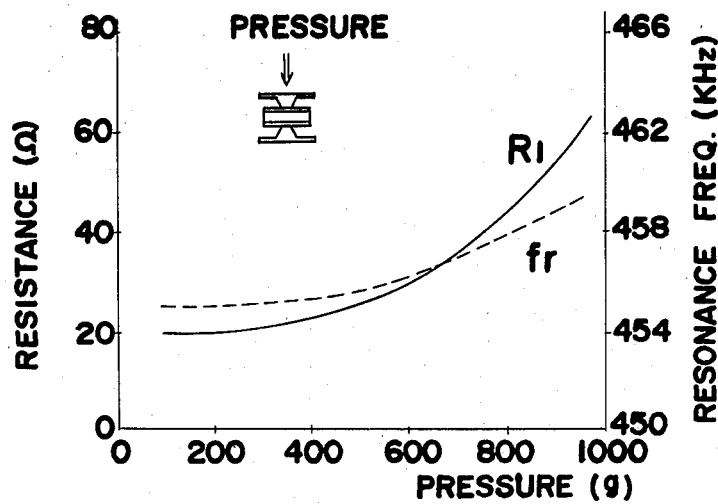
FIGS. 37(a) to 37(c) are graphs showing resistance characteristics and resonance frequency characteristics of the piezoelectric unit in accordance with a change in supporting pressure in three different supporting conditions.
Figure 37B:
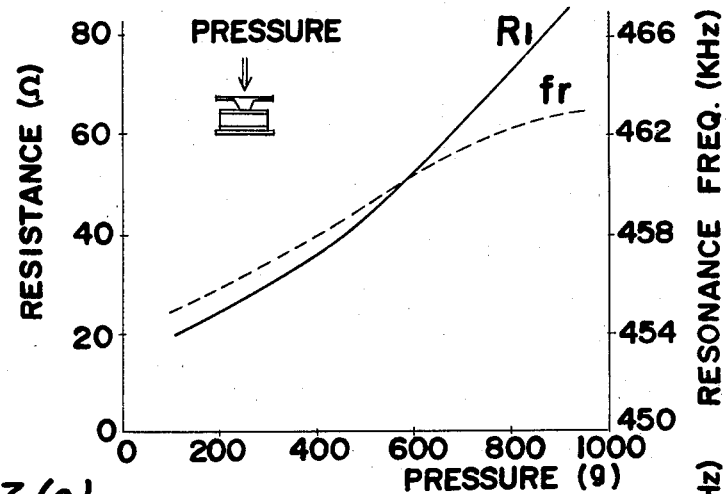
Figure 37C:
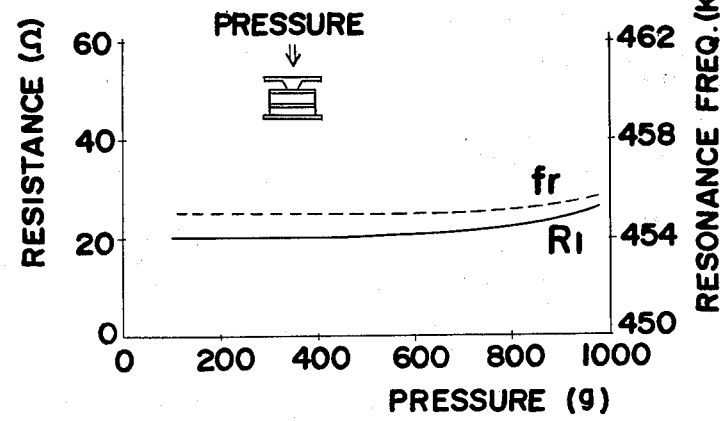

Referring to FIGS. 37(a) to 37(c), there are shown graphs of resistance characteristics and resonance frequency characteristics with respect to the change in the holding pressure. FIG. 37(a) shows resistance characteristic curve R1 and resonance frequency characteristic curve fr obtained when the two electrode type piezoelectric unit is held between two projections at the center of the unit where the vibration node exists. FIG. 37(b) shows the same characteristic curves R1 and fr obtained when the two electrode type piezoelectric unit is held between a projection and a plain terminal plate in which the projection is held in contact with the vibration node while the plain plate is held in contact with entire surface. FIG. 37(c) shows the same characteristic curves R1 and fr obtained when the two electrode type piezoelectric unit is held between a projection and a rubber sheet. In this case, the rubber sheet is placed over a plain terminal plate. As apparent from the three graphs, the resistance characteristic curve R1 and resonance frequency characteristic curve fr exhibit a stable condition when the rubber sheet is employed. Although the above curves are obtained when two electrode type piezoelectric unit is employed, a similar result is obtained when three electrode type piezoelectric unit is employed. Therefore, so long as the rubber sheet is employed, it is not necessary to take the holding pressure into consideration.

Referring to FIGS. 38(a) to 38(c), a piezoelectric device D6 is shown. The device D6 includes the casing 40, the two electrode type piezoelectric unit 41, a rubber sheet 55 and two terminal members 56 and 57 in which the terminal member 56 is made of metal plate having a projection 56a and a terminal leg 56b while the terminal member 57 is made of a plain metal plate having a terminal leg 57a.

Next, a manner in which the constructing parts are incorporated in the casing is described. The rubber sheet 55 is placed across the first surface of the piezoelectric unit 41 on which the extended electrode 45c is laminated in such a manner that the rubber sheet is held in contact only with the first electrode 45a. Accordingly, when the terminal member 57 is placed over the rubber sheet 55, the first electrode is electrically connected to the terminal member 57 through the rubber sheet 55 while the extended electrode 45c is maintained open. The second terminal member 56 is placed on the second surface of the piezoelectric unit 41 so that the projection 56a is held in contact with the second electrode.

Figure 39A:
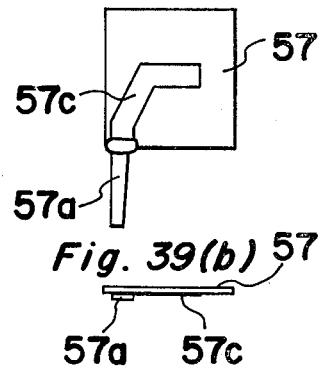
FIGS. 39(a) and 39(b) are top and side-elevational views showing a modification of a terminal member incorporated in the piezoelectric device shown in FIGS. 38(a) to 38(c)
Figure 39B:
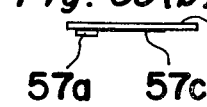

Instead of the metal plain plate, the terminal member 57 can be formed by a plate made of non-conductive material, as shown in FIGS. 39(a) and 39(b). In this case, the plate is provided with printed electrode 57c while the terminal leg 57a is soldered to the printed electrode 57c.

Referring to FIGS. 40(a) to 40(c), a piezoelectric device D7 is shown. The device D7 includes the casing 40, the three electrode type piezoelectric unit 46, the rubber sheet 55 and three terminal members 58, 59 and 60. The terminal member 58 is made of metal plate having a projection 58a and a terminal leg 58b. The terminal member 59 is made of metal plate having a terminal leg 59a and the terminal member 60 is made of metal plate having two arms 60a and 60b and a terminal leg 60c which are arranged in "F" shape.

When constructing the parts, the rubber sheet 55 is placed over the first surface of the piezoelectric unit 46 in such a manner that the rubber sheet overlaps center and rim electrodes 51a and 51b. The second terminal member 59 is positioned in such a manner that its plate portion overlaps the center electrode 51a through the rubber sheet 55 while the third terminal member 60 is positioned in such a manner that its arms 60a and 60b overlaps, through the rubber sheet 55, the rim electrode 51b. The second terminal member 58 is placed on the second surface of the piezoelectric unit 46 so that the projection 58a is held in contact with the third electrode 51c.

Instead of the metal plates, the terminal members 59 and 60 can be formed by a plate member of non-conductive material, as shown in FIGS. 41(a) and 41(b). In this case, the plate is provided with printed electrodes 60d and 59b in a pattern similar to the arrangement of the plate portion in the terminal member 59 and two arms 60a and 60b.

It is to be noted that the central frequency of the devices D6 and D7 are arranged to be equal to their fundamental frequency.

Since the piezoelectric unit has the extended electrode, the spurious mode is eliminated.

Furthermore, since the rubber sheet 55 is employed in the devices D6 and D7, it is not necessary to take the holding pressure of the piezoelectric unit into consideration.

Next, the piezoelectric devices employing two rubber sheets, one on each side of the piezoelectric unit are described.

Referring to FIGS. 42(a) to 42(c), a piezoelectric device D8 is shown. The device D8 has a similar structure to that of the device D6 shown in FIGS. 38(a) to 38(c), but is provided with another rubber sheet 61 attached to the second surface of the piezoelectric unit 41. Since the piezoelectric unit is vibrantly supported by the rubber sheets 55 and 61, it is not necessary to provide any projection on the terminal member 56.

Figure 43A:
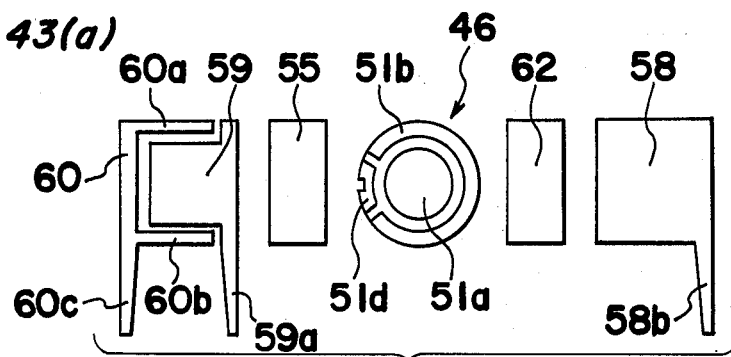
FIGS. 43(a) to 43(c) are views similar to FIGS. 32(a) to 32(c) but show a still further modification thereof.
Figure 43B:
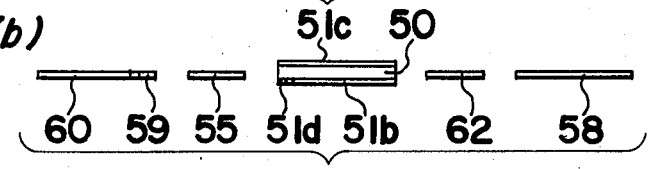
Figure 43C:
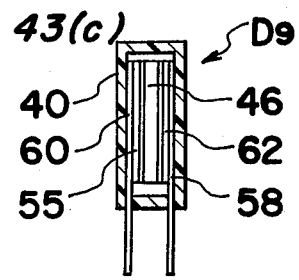

Referring to FIGS. 43(a) to 43(c), a piezoelectric device D9 is shown. The device D9 has a similar structure to that of the device D7 shown in FIGS. 40(a) to 40(c), but provided with another rubber sheet 62 which is attached to the second surface of the piezoelectric unit 46. Since the piezoelectric unit is vibrantly supported by the rubber sheets 55 and 62, it is not necessary to provide any projection on the terminal member 58.

Now the piezoelectric devices having the terminal members disposed on the first surface of the piezoelectric unit are described.

Figure 44A:
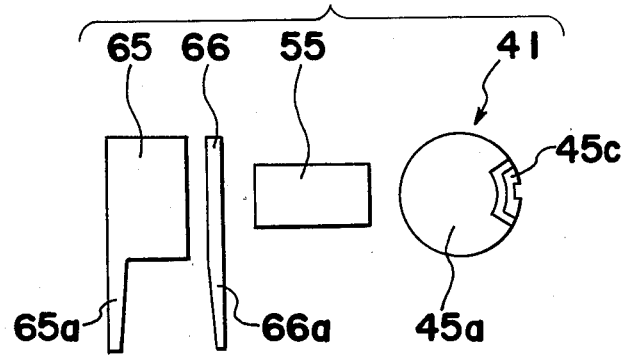
FIGS. 44(a) to 44(c) are views similar to FIGS. 32(a) to 32(c) but show a further modification thereof.
Figure 44C:
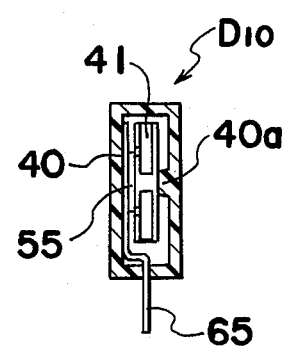
Figure 44B:
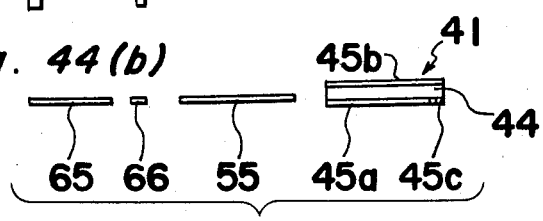

Referring to FIGS. 44(a) to 44(c), a piezoelectric device D10 is shown. The device D10 includes the casing 40, two electrode type piezoelectric unit 41, rubber sheet 55 and two terminal members 65 and 66. The terminal member 65 is made of metal plate having a terminal leg 65a while the terminal member 66 is made of metal plate having a terminal leg 66a.

When constructing the parts, the rubber sheet 55 is placed over the first surface of the piezoelectric unit 41 in such a manner that the rubber sheet overlaps the first electrode 45a and also the extended electrode 45c. The terminal member 65 is placed over the rubber sheet 55 at a position where the first electrode 45a is located under the rubber sheet 55 while the terminal member 66 is placed over the rubber sheet 55 at a position where the extended electrode 45c is located under the rubber sheet 55. Since the rubber sheet has the anisotropic conduction characteristics, the first electrode 45a is connected only to the terminal plate 65 while the extended electrode 45a is connected only to the terminal plate 66. The casing 40 has a projection 40a extending inwardly towards the center of the piezoelectric unit 41 so that the unit 41 can be held between the rubber sheet 55 and the projection 40a.

Figure 45A:
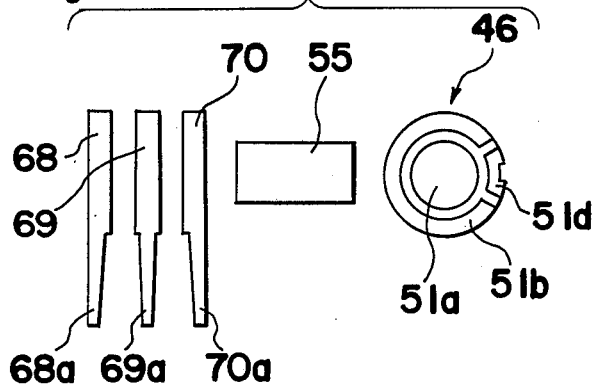
FIGS. 45(a) to 45(c) are views similar to FIGS. 32(a) to 32(c) but show a further modification thereof.
Figure 45C:
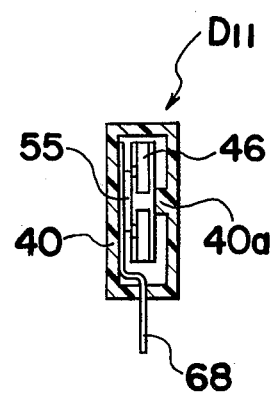
Figure 45B:
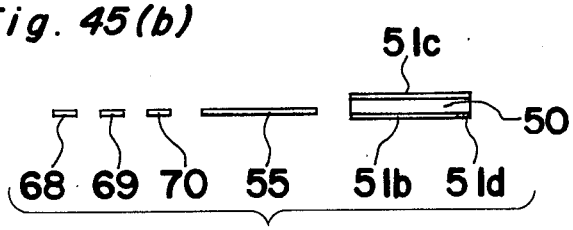

Referring to FIGS. 45(a) to 45(c), a piezoelectric device D11 is shown. The device D11 includes the casing 40 provided with the projection 40a, three electrode type piezoelectric unit 46, rubber sheet 55 and three terminal members 68, 69 and 70. Each of the terminal members 68, 69 and 70 made of metal plate has terminal legs 68a, 69a and 70a, respectively.

When constructing the parts, the rubber sheet 55 is place over the first surface of the piezoelectric unit 41 in such a manner that the rubber sheet overlaps the first or center electrode 51a, second or rim electrode 51b and extended electrode 51d. The terminal member 68 is placed over the rubber sheet 55 at a position where the rim electrode 51b is located under the rubber sheet 55, the terminal member 69 is placed over the rubber sheet 55 at a position where the center electrode 51a is located under the rubber sheet 55, and the terminal member 70 is placed over the rubber sheet 55 at a position where the extended electrode 51d is located under the rubber sheet 55. The piezoelectric unit 46 is held in position between the projection 40a and the rubber sheet 55.

Next, various modifications of the piezoelectric devices D10 and D11 are described below.

Figure 46A:
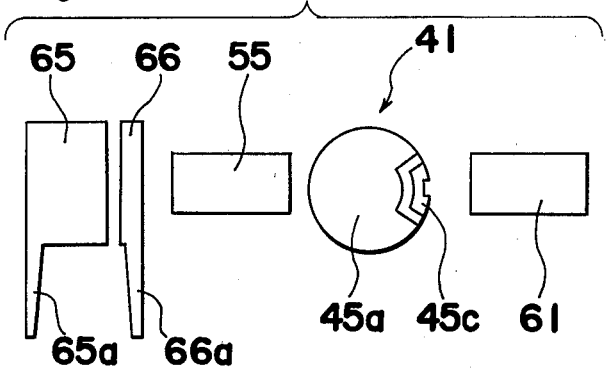
FIGS. 46(a) to 46(c) are views similar to FIGS. 32(a) to 32(c) but show a further modification thereof.
Figure 46C:
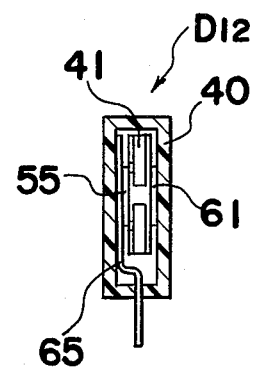
Figure 46B:
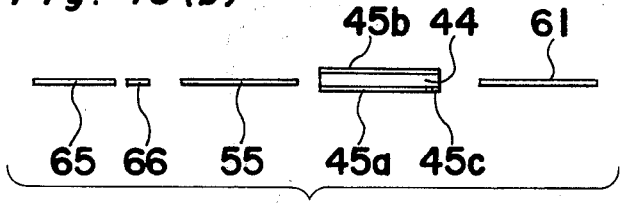

Referring to FIGS. 46(a) to 46(c), a piezoelectric device D12 is shown. The device D12 has a similar structure to that of the device D10 shown in FIGS. 44(a) to 44(c), but is provided with another rubber sheet 61 attached to the second surface of the piezoelectric unit 41. Since the piezoelectric unit is vibrantly supported by the rubber sheets 55 and 61, it is not necessary to provide any projection 40a in the casing 40.

Figure 47A:
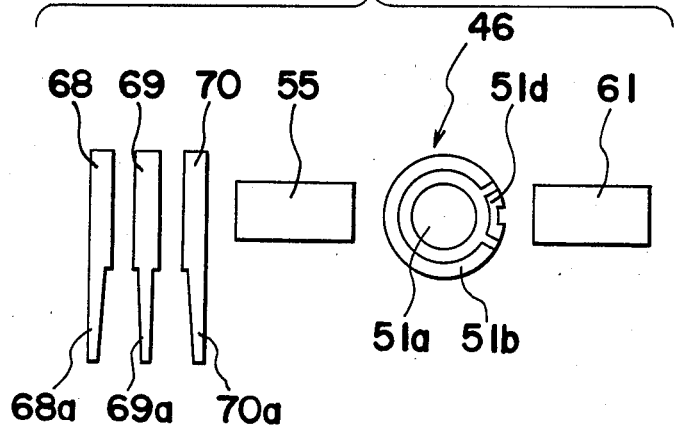
FIGS. 47(a) to 47(c) are views similar to FIGS. 32(a) to 32(c) but show a further modification thereof.
Figure 47C:
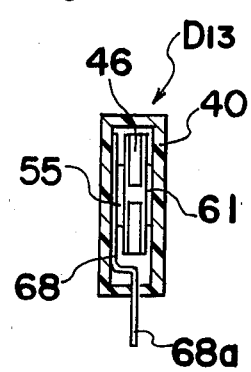
Figure 47B:
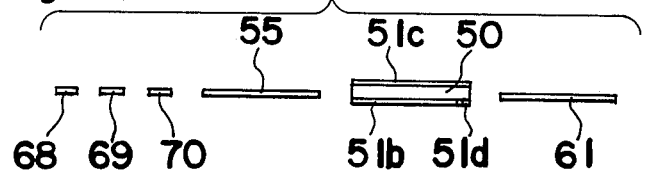

Referring to FIGS. 47(a) to 47(c), a piezoelectric device D13 is shown. The device D13 has a similar structure to that of the device D11 shown in FIGS. 45(a) to 45(c), but is provided with another rubber sheet 61 attached to the second surface of the piezoelectric unit 46 for supporting the unit 46 between the two rubber sheets 55 and 61.

Figure 48A:
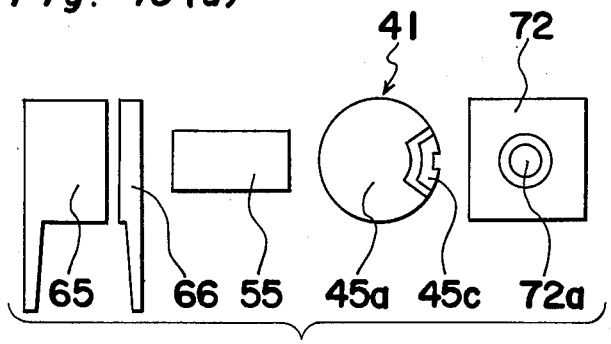
FIGS. 48(a) to 48(c) are views similar to FIGS. 32(a) to 32(c) but show a further modification thereof.
Figure 48C:
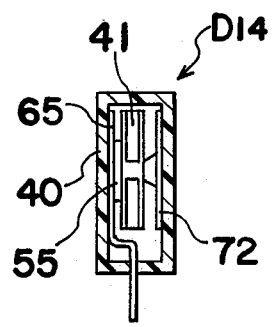
Figure 48B:
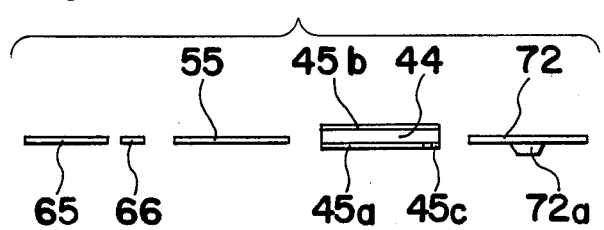

Referring to FIGS. 48(a), to 48(c) a piezoelectric device D14 is shown. The device D14 has a similar structure to that of the device D10, but is provided with a supporting member 72 having a projection 72a at its center for supporting the unit 41 between the rubber sheet 55 and the projection 72a. In this case it is not necessary to provide the projection 40a in the casing 40.

Figure 49A:
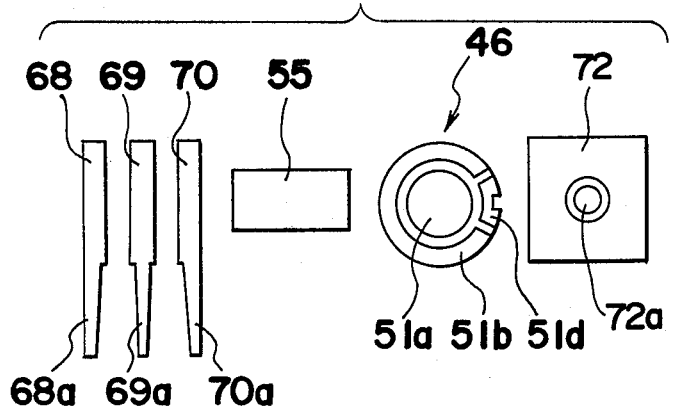
FIGS. 49(a) to 49(c) are views similar to FIGS. 32(a) to 32(c) but show a further modification thereof.
Figure 49C:
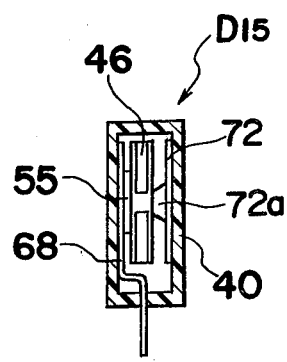
Figure 49B:
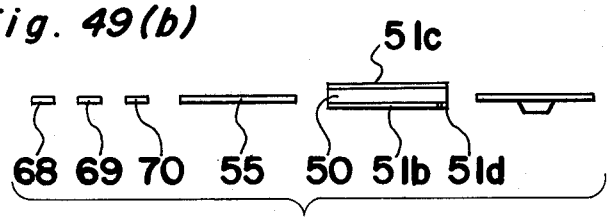

Referring to FIGS. 49(a) to 49(c), a piezoelectric device D15 is shown. The device D15 has a similar structure to that of the device D11, but is provided with supporting member 72 having a projection 72a for supporting the unit 46 between the rubber sheet 55 and the projection 72a. Therefore, no projection 40a is provided in the casing 40.

Figure 50A:
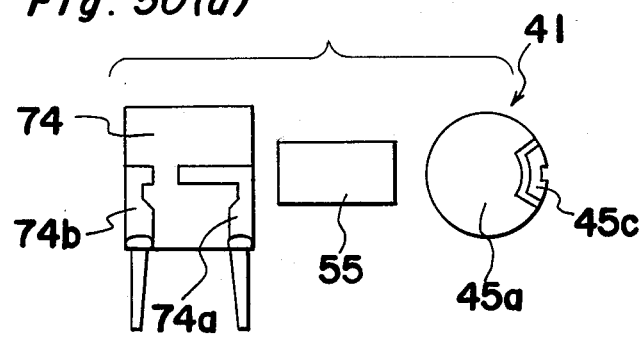
FIGS. 50(a) to 50(c) are views similar to FIGS. 32(a) to 32(c) but show a further modification thereof.
Figure 50C:
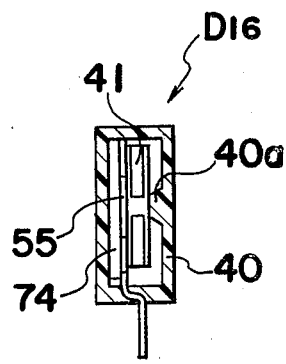
Figure 50B:
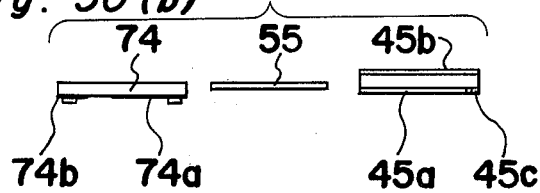

Referring to FIGS. 50(a) to 50(c), a piezoelectric device D16 is shown. The device D16 has a similar structure to that of the device D10 except the arrangement of the terminal members. Instead of providing two separate terminal members, the device D16 has a terminal plate 74 made of non-conductive material with printed electrodes 74a and 74b which are arranged in a pattern similar to the disposition of the terminal members 65 and 66. The terminal legs are soldered to the printed electrodes.

Figure 51A:
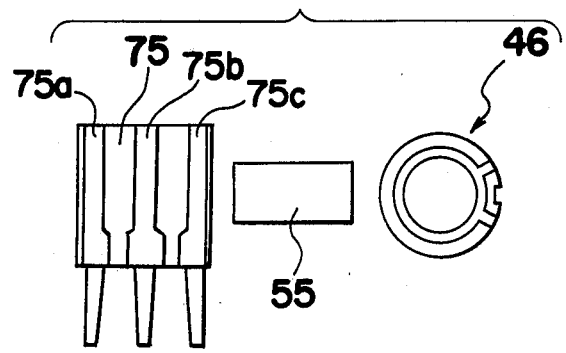
FIGS. 51(a) to 51(c) are views similar to FIGS. 32(a) to 32(c) but show a further modification thereof.
Figure 51B:
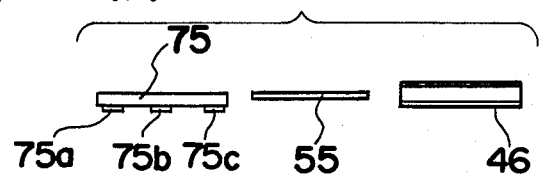
Figure 51C:
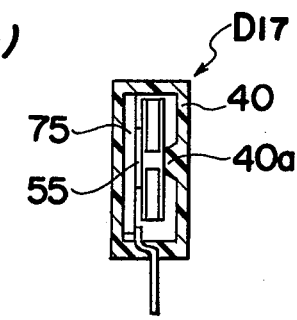

Referring to FIGS. 51(a) to 51(b), a piezoelectric device D17 is shown. The device D17 has a similar structure to that of the device D11 except the arrangement of the terminal members. Instead of providing three separate terminal members, the device D17 has a terminal plate 75 made of non-conductive material with printed electrodes 75a, 75b and 75c which are arranged in a pattern similar to the disposition of the terminal members 68, 69 and 70. The terminal legs are soldered to the printed electrodes.

Although the present invention has been fully described by way of examples with reference to the accompanying drawings, it is to be noted that various changes and modifications are apparent to those skilled in the art. For example, the terminal members can be arranged in arc as disclosed in Japanse Patent Laid-Open Publication No. 25246/1978 published on Mar. 3, 1978. Therefore, such changes and modifications are, unless they depart from the true scope of the present invention, to be understood as included therein.

What is claimed is:

1. A three terminal piezoelectric unit, comprising:
   (a) a planar piezoelectric body having oppositely facing first and second flat surfaces which are rectangular in shape;
   (b) a first electrode located on a central portion of said first surface of said piezoelectric body;
   (c) a second electrode located on the entire said second surface of said piezoelectric body;
   (d) a rim electrode surrounding said first electrode and located adjacent all edges of said first surface except one central portion of one side edge of said first surface;
   (e) an extended electrode located on said one central portion of one side edge of said first surface in a spaced relation to both said first electrode and said rim electrode;
   (f) a runner electrode electrically connecting said second electrode with said extended electrode such that when said piezoelectric unit is excited and vibrated primarily in the breathing mode, spurious harmonic vibrations are dampened.

2. A piezoelectric unit as claimed in claim 1, wherein said first electrode means is constituted by a first electrode.

3. A piezoelectric unit as claimed in claim 1, wherein said first electrode means includes a center electrode laminated on a central portion of the first surface and a rim electrode laminated on a peripheral portion exclusive of said one periphral portion of the first surface, said center electrode and said rim electrode being in a separated relation to each other.

4. A piezoelectric unit as claimed in claim 1, 2 or 3, wherein said second electrode means is constituted by one electrode laminated on the second surface and covering substantially all of said second surface.

5. A piezoelectric unit as claimed in claim 1, wherein said runner electrode is laminated on a side surface of the piezoelectric body.

6. A piezoelectric unit as claimed in claim 1 further comprising a groove formed in a side surface of the piezoelectric body between said one peripheral portion and said second surface for providing the runner electrode therein.

7. A piezoelectric unit as claimed in claim 1 further comprising a hole formed in the piezoelectric body extending between said one peripheral portion and said second surface for providing the runner electrode therein.

8. A piezoelectric device, comprising:
   (a) a casing;
   (b) a first piezoelectric unit incorporated in said casing, said first piezoelectric unit comprising:
      (i) a planar piezoelectric body having oppositely facing first and second flat surfaces which are rectangular in shape;
      (ii) a first electrode located on a central portion of said first surface of said piezoelectric body;
      (iii) a second electrode located on the entire said second surface of said piezoelectric body;
      (iv) a rim electrode surrounding said first electrode and located adjacent all edges of said first surface except one central portion of one side edge of said first surface;
      (v) an extended electrode laminated on said one peripheral portion of said first surface in a spaced relationship to said first electrode; and
      (vi) a runnr electrode electrically connecting said second electrode with said extended electrode whereby when said piezoelectric unit is excited and vibrated primarily in the breathing mode, spurious harmonic vibrations are dampened;
   (c) a base plate made of electrically non-conductive material and incorporated in said casing for dividing the casing into first and second compartments, said base plate having a first group of printed electrodes provided on a first surface thereof facing said first compartment;
   (d) a first terminal means connected to respective printed electrodes on said first surface of said base plate, each terminal of said first terminal means having a terminal leg extending outwardly from the casing for the external connection thereof;
   (e) a first direction-oriented electroconductive pliable sheet sandwiched between said first surface of said first piezoelectric unit and said first surface of said base plate in such a manner that the laminated electrodes of said first electrode means and said extended electrodes on said piezoelectric body are in face-to-face relation through the first direction-oriented electroconductive pliable sheet to corresponding printed electrodes on said first surface of said base plate; and
   (f) a first attaching projection rigidly held in said first compartment of said casing, said first attaching projection being held in contact with a central portion of said second surface of said first piezoelectric unit for vibrantly supporting said first piezoelectric unit.

9. A piezoelectric device as claimed in claim 8 further comprising a second piezoelectric unit incorporated in the second compartment of the casing; a second group of printed electrodes provided on a second surface of the base plate facing the second compartment; a second terminal means connected to respective printed electrodes on the second surface of the base plate, each terminal of said terminal members having a terminal leg extending outwardly from the casing for the external connection thereof; a second direction-oriented electroconductive pliable sheet sandwiched between the first surface of the second piezoelectric unit and the second surface of the base plate in such a manner that the laminated electrodes of the first group and the extended electrode on the piezoelectric body are in face-to-face relation, through the second direction-oriented electroconductive pliable sheet, to corresponding printed electrodes on the second surface of the base plate; and a second attaching projection rigidly held in the second compartment of the casing, said second attaching projection being held in contact with a central portion of the second surface of the second piezoelectric unit for vibrantly supporting the second piezoelectric unit.

10. A piezoelectric device as claimed in claim 9, wherein said base plate has an opening formed in the center and further comprising a first capacitor mounted in the opening and held between the first and second direction-oriented electroconductive pliable sheet.

11. A piezoelectric device as claimed in claim 8, further comprising a second group of printed electrodes provided on a second surface of the bsae plate facing the second compartment; a second terminal means connected to respective printed electrodes on the second surface of the base plate, each terminal of said second terminal means having a terminal leg extending outwardly from the casing for the external connection thereof; and an electric circuit arrangement incorporated in the second compartment and connected to the second terminal means.

12. A piezoelectric device as claimed in claim 11, wherein said electric circuit arrangement includes first and second capacitor elements.

* * * * *